(12) United States Patent
Matsunaga

(10) Patent No.: US 9,425,225 B2
(45) Date of Patent: Aug. 23, 2016

(54) SOLID-STATE IMAGING DEVICE

(71) Applicant: Panasonic Intelectual Property Management Co., Ltd., Osaka (JP)

(72) Inventor: Yoshiyuki Matsunaga, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/084,709

(22) Filed: Nov. 20, 2013

(65) Prior Publication Data

US 2014/0077067 A1    Mar. 20, 2014

Related U.S. Application Data

(63) Continuation of application No. PCT/JP2012/003314, filed on May 21, 2012.

(30) Foreign Application Priority Data

May 24, 2011   (JP) ................................. 2011-116403

(51) Int. Cl.
   *H01L 27/146*        (2006.01)
(52) U.S. Cl.
   CPC ...... *H01L 27/14612* (2013.01); *H01L 27/1463* (2013.01); *H01L 27/14643* (2013.01)

(58) Field of Classification Search
   CPC .................. H01L 27/14609; H01L 27/14643; H01L 27/14689
   See application file for complete search history.

(56) References Cited

U.S. PATENT DOCUMENTS

2007/0278536 A1*  12/2007  Adachi ......................... 257/239
2011/0073923 A1*   3/2011  Tatani ............... H01L 27/14603
                                                    257/291

\* cited by examiner

*Primary Examiner* — Mohammad Islam
*Assistant Examiner* — Charles R Peters
(74) *Attorney, Agent, or Firm* — McDermott Will & Emery LLP

(57) ABSTRACT

Unit pixel cells each includes: a photoelectric conversion film; a transparent electrode; a pixel electrode; an amplification transistor; a reset transistor; and an element isolation STI and a leakage suppression region for electrically isolating the amplification transistor and the reset transistor, the first isolation region being in a silicon substrate, between the amplification transistor and the reset transistor, the reset transistor including: a gate electrode; and a drain region which is connected to the pixel electrode, and is in the silicon substrate, between the gate electrode and element isolation STI and the leakage suppression region, in which a depletion layer formed by a first PN junction between the drain region and its surrounding region and in contact with a surface of the silicon substrate is narrower than a depletion layer formed by a second PN junction between the drain region and its surrounding region and formed in the silicon substrate.

33 Claims, 18 Drawing Sheets

SOLID-STATE IMAGING DEVICE

CROSS REFERENCE TO RELATED APPLICATIONS

This is a continuation application of PCT International Application No. PCT/JP2012/003314 filed on May 21, 2012, designating the United States of America, which is based on and claims priority of Japanese Patent Application No. 2011-116403 filed on May 24, 2011. The entire disclosures of the above-identified applications, including the specifications, drawings and claims are incorporated herein by reference in their entirety.

FIELD

One or more exemplary embodiments disclosed herein relate generally to solid-state imaging devices and, in particular, to a stacked solid-state imaging device.

BACKGROUND

In recent years, the miniaturization of unit pixel cells in a charge coupled device (CCD) or metal oxide semiconductor (MOS) solid-state imaging device (image sensor) has been rapidly advanced. The solid-state imaging device has a photodiode (photoelectric conversion unit) in a semiconductor substrate made of crystalline silicon, and a CCD or a MOS as a scanning circuit. The cell size (size of unit pixel cell) was 3 μm around 2000, decreasing to 2 μm or less around 2007. Solid-state imaging devices having unit pixel cells of around 1.4 μm are expected to be put into production in 2010. If the miniaturization of cells is being advanced at this pace, the size of the cells is expected to be less than 1 μm within the next several years.

However, there are two major problems to realize a cell size of 1 μm or less. A first problem is due to the small optical absorption coefficient of crystalline silicon. A second problem relates to a signal amount to be handled.

The following details the first problem. The optical absorption coefficient of crystalline silicon depends on the wavelength of light. Crystalline silicon having a thickness of 3.5 μm is necessary for absorbing almost 100% of green light near a wavelength of 550 nm which decides the sensitivity of an image sensor and photo-electrically converting. Therefore, it is necessary to photo-electrically convert and collect signal charges on the condition that the depth of a photodiode to be formed in a semiconductor substrate is around 3.5 μm. However, it is extremely difficult to form a photodiode having a planar cell size of 1μ square and a depth of around 3.5 μm. Even if a photodiode having a depth of around 3.5 μm can be formed, a problem may arise with high possibility that obliquely incident light is incident on the photodiodes of adjacent pixel cells. When the obliquely incident light is incident on the photodiodes of the adjacent pixel cells, color mixture (crosstalk) is caused. This is a major problem for color solid-state imaging devices. Meanwhile, when a photodiode having a depth less than 3.5 μm is formed to prevent the color mixture, the absorption efficiency of green light and the sensitivity of an image sensor are degraded. In the miniaturization of a unit pixel cell, the sensitivity of a unit pixel cell is degraded with decrease in a cell size. Therefore, degradation in light absorption efficiency in addition to this is fatal. The issue of the color mixture arises in varying degrees. For example, when a depth of 3.5 μm is required, the issue of the color mixture arises at a size of a unit pixel cell of around 3.5μ square or less.

The following describes the second problem. The signal amount to be handled depends on the saturation charge amount of a buried photodiode having a photodiode structure used in almost all the crystalline-silicon image sensors. The buried photodiode has the advantage that it can transfer almost 100% of signal charges stored therein to an adjacent charge detection unit (complete transfer). Therefore, as little noise relating to charge transfer is generated, this buried photodiode is widely used for image sensors. However, the capacity of the buried photodiode per unit area cannot be increased in order to achieve this complete transfer. Therefore, the saturation charge amount is needed to be decreases with the miniaturization of a unit pixel cell. In a compact digital camera, 10,000 saturation electrons per unit pixel cell are required. However, when the size of the unit pixel cell is around 1.4 μm, the limit is around 5000 electrons. To response to decrease in the number of saturation electrons, an image is generated by, for example, noise suppression processing performed by the technique of digital signal processing. However, it is difficult to obtain a natural reproduced image. Furthermore, for high-quality single lens reflex cameras, it is said that around 30,000 saturation electrons are necessary per unit pixel cell.

It should be noted that by abrading the surface of the crystalline silicon substrate of a MOS image sensor, the structure in which light is incident not on the front side where a pixel circuit is formed, but on the backside is brought into consideration. This structure is considered effective in the miniaturization of a unit pixel cell. Although this structure has the advantage that incident light is less likely to be prevented by lines and others making up the pixel circuit. However, even with this structure, the two problems cannot be solved at all.

The stacked image sensors disclosed in Patent Literatures 1, 2, and 3 are examples of the structure to solve the two problems. The stacked image sensors have the structure in which a photoelectric conversion film is formed, via an insulating film, above a semiconductor substrate (crystalline silicon) where a pixel circuit is formed. This enables the selection of a material having a large optical absorption coefficient for the photoelectric conversion film. Thus, the first problem can be solved. For instance, when amorphous silicon is used for the photoelectric conversion film, green light having a wavelength of 550 nm can be mostly absorbed at a film thickness of 0.4 μm. That is, green light can be absorbed at a thickness which is around single-digit less than that of crystalline silicon. It is rare that the absorption coefficient of crystalline silicon is small. This is because the transition of electrons in the band gap of a semiconductor is indirect transition. Moreover, since a buried photodiode is not used, it is possible to use a large capacity for a photoelectric conversion unit, and increase saturation electrons. Furthermore, since the charges are not completely transferred, the addition of capacitance can be facilitated, and sufficiently large capacitance of the photoelectric conversion unit can be achieved even in a miniaturized unit pixel cell. Thus, the second problem can be also solved. The image sensor may have a structure as the stack cell of a dynamic random access memory (DRAM).

CITATION LIST

Patent Literature

[PTL1] Japanese Examined Patent Application Publication No. 58-050030

[PTL2] U.S. Pat. No. 6,730,914

[PTL3] Japanese Unexamined Patent Application Publication No. 3-135175

SUMMARY

Technical Problem

A PN junction portion is formed in a silicon substrate, and the PN junction portion is electrically connected to a contact for transferring signal charges photo-electrically converted by a photoelectric conversion film. Here, the problem relating to stacked image sensors is in that the leakage current in this PN junction portion is large. In order to reduce the leakage current, there is a method of setting a reverse bias voltage in the PN junction to around 0 V as patent literatures (PTLs) 1 and 2. However, this method is insufficient for suppressing the leakage current, compared to buried photodiodes widely used in image sensors. It is not possible to distinguish between charges from leakage current and photo-electrically converted signal charges. This leads to noise and degrades the performance of an image sensor. This means that increase in noise degrades a signal-to-noise ratio (SN ratio), resulting in degradation in sensitivity.

In particular, an energy level is likely to be formed in a band gap, in a PN junction portion in contact with the surface of a semiconductor substrate, i.e., a depletion layer formed in the place in which the surface of the semiconductor substrate and the PN junction plane are in contact. A current is likely to flow at the energy level. Therefore, leakage current is likely to occur in the PN junction portion in contact with the surface of the semiconductor substrate.

For example, as shown in FIG. 19, in the image sensor in patent literature (PTL) 3, a photoelectric conversion film 101, a transparent electrode 102, a pixel electrode 103, and an insulating layer 104 are formed above a semiconductor substrate. Impurity regions forming a transistor and others are formed in the semiconductor substrate. Among the impurity regions, a p-type impurity region 105 connected to a contact 107 and an n-type impurity region 106 connected to the impurity region 105 form a PN junction portion in contact with the surface of the semiconductor substrate. Therefore, in the image sensor recited in PTL 3, leakage current is likely to occur in the PN junction portion in contact with the surface of the semiconductor substrate.

In view of the problem, the present disclosure disclosed herein provides a stacked solid-state imaging device with small leakage current.

Solution to Problem

In one general aspect, the techniques disclosed here feature a solid-state imaging device which includes: a first conductivity type semiconductor substrate; and a plurality of unit pixel cells arranged two-dimensionally on the semiconductor substrate, the plurality of unit pixel cells each including: a photoelectric conversion film for photo-electrically converting incident light, the photoelectric conversion film being above the semiconductor substrate; a transparent electrode on the photoelectric conversion film; a pixel electrode between the semiconductor substrate and the photoelectric conversion film; an amplification transistor for outputting a signal voltage according to a potential of the pixel electrode, the amplification transistor being on the semiconductor substrate and having a first gate electrode connected to the pixel electrode; a reset transistor for resetting a potential of the first gate electrode, the reset transistor being on the semiconductor substrate; and a first isolation region for electrically isolating the amplification transistor and the reset transistor, the first isolation region being in the semiconductor substrate, between the amplification transistor and the reset transistor, the reset transistor including: a second gate electrode; and a second conductivity type source or drain region which is connected to the pixel electrode, and is in the semiconductor substrate, between the second gate electrode and the first isolation region, in which a depletion layer formed by a first PN junction and in contact with a surface of the semiconductor substrate is narrower than a depletion layer formed by a second PN junction and formed in the semiconductor substrate, the first PN junction being in contact with the surface of the semiconductor substrate, between the second conductivity type source or drain region and its surrounding region, the second PN junction being in the semiconductor substrate, between the second conductivity type source or drain region and its surrounding region.

According to this aspect, since the depletion layer which is formed by the PN junction and is in contact with the surface of the semiconductor substrate is narrower than the other part of the depletion layer, it is possible to reduce a leakage current due to the PN junction portion in contact with the surface of the semiconductor substrate.

Here, the solid-state imaging device may further a second isolation region for electrically isolating two adjacent unit pixel cells included in the plurality of unit pixel cells, the second isolation region being a trench in the semiconductor substrate, between the two adjacent unit pixel cells, in which the first isolation region may be a first conductivity type region which is in the semiconductor substrate, and has a higher impurity concentration than the semiconductor substrate.

According to this aspect, the element isolation in the unit pixel cell is achieved only with the impurity region. Therefore, it is possible to suppress a leakage current due to stress caused by embedding into the semiconductor substrate, compared to the shallow trench isolation (STI) structure in which the element isolation is formed by forming the trench in the semiconductor substrate and embedding an oxide film into the trench.

Moreover, the reset transistor may further include a first conductivity type channel region formed in the semiconductor substrate below the second gate electrode, and having a higher impurity concentration than the semiconductor substrate.

Moreover, the reset transistor may have a higher threshold voltage than the amplification transistor.

According to this aspect, since the reset transistor has a high threshold voltage, it is possible to suppress, by making the channel region have a high impurity concentration, the expansion of the depletion layer formed by the PN junction portion of the source or drain region on the side where the second gate electrode is located.

Moreover, when the reset transistor is in OFF state, the second gate electrode may have a negative potential relative to a potential of the semiconductor substrate.

According to this aspect, electron holes are accumulated in the semiconductor substrate below the second gate electrode to which a negative potential has been applied. This narrows the depletion layer formed by the PN junction of the source or drain region on the side where the second gate electrode is located. As a result, it is possible to reduce the leakage current due to the PN junction portion in contact with the surface of the silicon substrate.

Moreover, the second conductivity type source or drain region may include a contact region connected to the pixel electrode and an extension region in contact with the contact region, the extension region having a lower impurity concentration than the contact region, the extension region may be between the first isolation region and the contact region, the plurality of unit pixel cells may each further include a first conductivity type leakage suppression region which is in the semiconductor substrate, between the extension region and the first isolation region, and in contact with the extension region and the first isolation region, the first PN junction may be between the first conductivity type leakage suppression region and an edge of the extension region on a side where the first isolation region is located, and the first conductivity type leakage suppression region may have a higher impurity concentration than the semiconductor substrate and a lower impurity concentration than the extension region.

According to this aspect, the width of the depletion layer which is formed by the PN junction of the source or drain region on the side where the first isolation region is located and is in contact with the surface of the semiconductor substrate and can be narrowed. Therefore, it is possible to reduce the leakage current due to the PN junction portion in contact with the surface of the semiconductor substrate. Moreover, the leakage suppression region having a higher impurity concentration than the semiconductor substrate is provided next to the source or drain region. Therefore, the leakage current can be further reduced. Here, the PN junction portion is formed of the extension region of a low impurity concentration. Therefore, even when the distance between the leakage suppression region and the extension region is narrowed, and the two regions are overlapped in order to narrow the depletion layer, the breakdown of the PN junction portion can be suppressed.

Moreover, the second conductivity type source or drain region may include a contact region connected to the pixel electrode and an extension region in contact with the contact region, the extension region having a lower impurity concentration than the contact region, the extension region may be between the contact region and the second gate electrode, the first PN junction may be between the semiconductor substrate and an edge of the contact region on a side where the first isolation region is located, the plurality of unit pixel cells may each further include a first conductivity type leakage suppression region which (i) is in the semiconductor substrate, between the contact region and the first isolation region, (ii) is spaced apart from the contact region, and (iii) is in contact with the first isolation region, and the first conductivity type leakage suppression region may have a higher impurity concentration than the semiconductor substrate and a lower impurity concentration than the extension region.

According to this aspect, the width of the depletion layer which is formed by the PN junction portion of the source or drain region on the side where the first isolation region is located and is in contact with the surface of the semiconductor substrate is narrowed by shortening the distance between the contact region and the leakage suppression region without contact. Therefore, it is possible to reduce the leakage current due to the PN junction portion in contact with the surface of the semiconductor substrate. Moreover, the leakage suppression region having a higher impurity concentration than the semiconductor substrate is provided next to the source or drain region. Therefore, the leakage current can be further reduced. Here, the PN junction portion is formed of the contact region having a high impurity concentration. However, since the contact region is not in contact with the leakage suppression region, the breakdown of the PN junction portion can be suppressed.

Moreover, a distance between the first conductivity type leakage suppression region and the contact region may be greater than 0.1 µm.

According to this aspect, it is possible to suppress with high possibility the breakdown of the PN junction portion of the source or drain region on the side where the first isolation region is located.

Moreover, the first isolation region may be a trench in the semiconductor substrate.

According to this aspect, since the element isolation in the unit pixel cell is a trench, the element isolation in the unit pixel cell can be achieved with high accuracy.

Moreover, the solid-state imaging device may further include a second isolation region for electrically isolating two adjacent unit pixel cells included in the plurality of unit pixel cells, the second isolation region being a trench in the semiconductor substrate, between the two adjacent unit pixel cells, in which the first isolation region may be a first conductivity type region which is in the semiconductor substrate, and has a higher impurity concentration than the semiconductor substrate.

According to this aspect, the element isolation in the unit pixel cell is formed of the PN junction, and the element isolation in the unit pixel cell is achieved only with the impurity region. Therefore, it is possible to suppress a leakage current due to stress caused by embedding into the semiconductor substrate, compared to the STI structure in which the element isolation is formed by forming the trench in the semiconductor substrate and embedding an oxide film into the trench.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to the present disclosure, it is possible to realize a high-performance stacked solid-state imaging device having a large SN ratio, i.e., with small noise.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
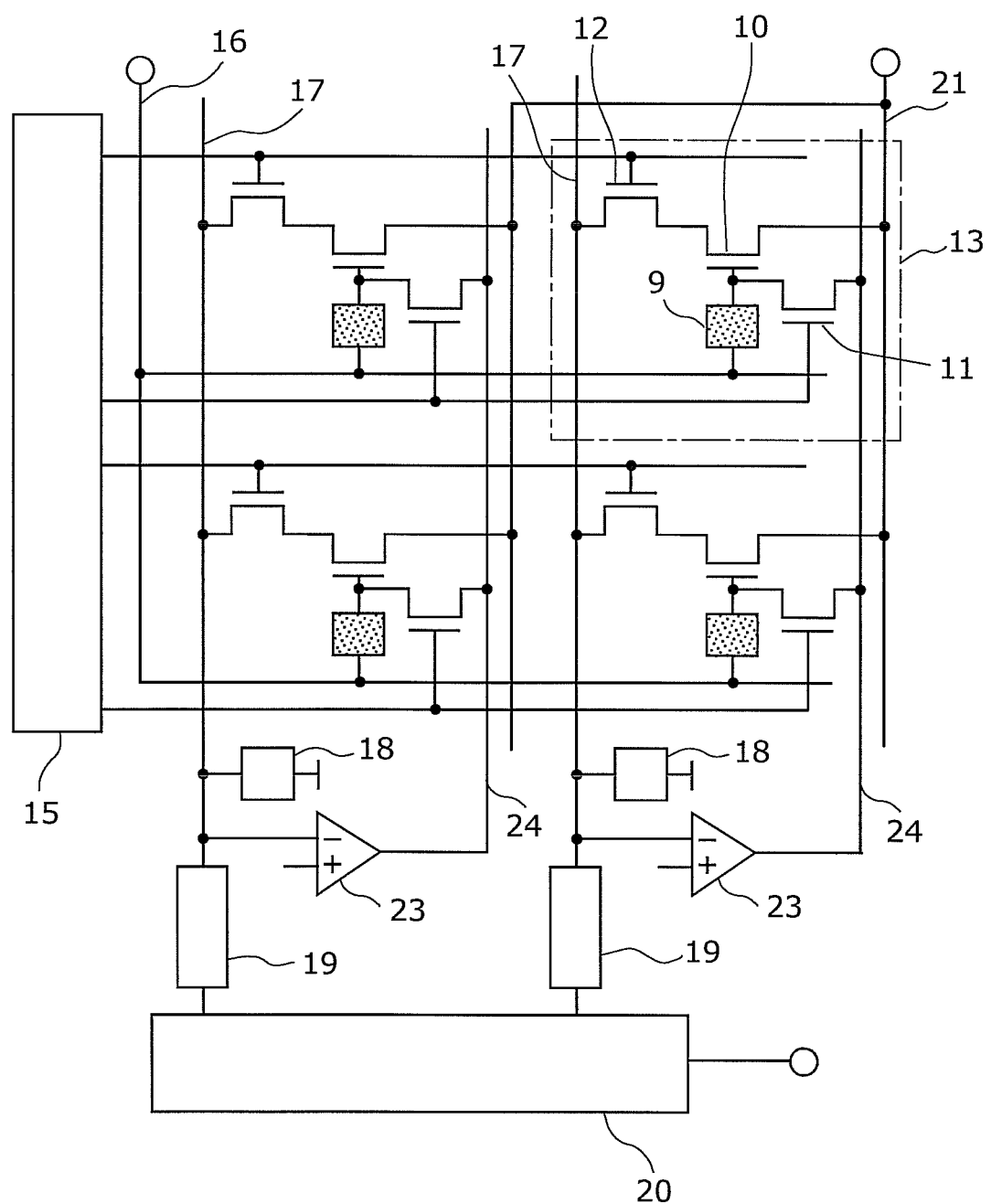
FIG. 1 is a circuit diagram showing the configuration of a solid-state imaging device according to Embodiment 1.

The following describes solid-state imaging devices according to the embodiments of the present disclosure with reference to drawings.

Moreover, the same reference numerals are given to the same elements representing the substantially the same structure, operation and effect. Moreover, all the numerical values described below are recited to specifically exemplify the present disclosure. However, the present disclosure is not limited to the exemplified numerical values. Furthermore, the connections between structural elements are recited to specifically exemplify the present disclosure. However, the connections which achieve the function of the present disclosure are not limited to the connections described below.

Embodiment 1

FIG. 1 is a circuit diagram showing the configuration of a solid-state imaging device according to Embodiment 1.

This solid-state imaging device is a stacked solid-state imaging device, and includes a semiconductor substrate, a photosensitive region made up of unit pixel cells 13 disposed two-dimensionally on the semiconductor substrate, and a driving circuit unit which successively drives the unit pixel cells 13 and extracts signals.

The driving circuit unit includes a vertical scanning unit (row scanning circuit) 15, a photoelectric conversion film control line 16, vertical signal lines (vertical signal line wirings) 17, load units 18, column signal processing units (row signal storage units) 19, a horizontal signal read unit (column scanning circuit) 20, a power source line (source follower power source) 21, differential amplifiers (feedback amplifiers) 23, and feedback lines 24.

The unit pixel cells 13 each include a photoelectric conversion film unit 9, an amplification transistor 10, a reset transistor 11, and an address transistor (row selection transistor) 12.

The photoelectric conversion film unit 9 photo-electrically converts incident light, and generates and stores signal charges according to the amount of the incident light. The amplification transistor 10 outputs a signal voltage according to the amount of signal charges generated by the photoelectric conversion film unit 9. The reset transistor 11 resets (initializes) the potential of the photoelectric conversion film unit 9, i.e., the potential of the gate electrode of the amplification transistor 10. The address transistor 12 causes the unit pixel cell 13 of a predetermined row to output a signal voltage to the vertical signal line 17.

The vertical scanning unit 15 applies row selection signals for controlling ON/OFF of the address transistors 12 to the gate electrodes of the address transistors 12 to scan the rows of the unit pixel cells 13 vertically (in column direction), and select one of the rows of the unit pixel cells 13 which are to be caused to output signal voltages to the vertical signal lines 17. The vertical scanning unit 15 applies a reset signal for controlling ON/OFF of the reset transistor 11 to the gate electrode of the reset transistor 11 to select one of the rows of unit pixel cells 13 which are to be caused to perform a reset operation.

All of the unit pixel cells 13 are connected to the same photoelectric conversion film control line 16, and the same positive constant voltage is applied to all of the photoelectric conversion film units 9.

The vertical signal lines 17 each correspond to one of the columns of the unit pixel cells 13. The vertical signal lines 17 are each connected to the source regions of the address transistors 12 in the unit pixel cells 13 belonging to a corresponding one of the columns. The vertical signal lines 17 transmit signal voltages in the column direction (vertically).

The load units 18 each correspond to one of the vertical signal lines 17, and are each connected to the corresponding one of the vertical signal lines 17. The load unit 18 forms a source follower circuit together with the amplification transistor 10.

The column signal processing unit 19 performs, for example, noise suppression signal processing represented by correlated double sampling and analog-to-digital conversion (AD conversion). The column signal processing units 19 each correspond to one of the vertical signal lines 17, and are each connected to the corresponding one of the vertical signal lines 17.

The horizontal signal read unit 20 successively reads signals from the column signal processing units 19 disposed horizontally (in the row direction) to a horizontal common signal line.

A power source line 21 is connected to the drain regions of the amplification transistors 10, and is provided vertically (in the vertical direction of the paper for FIG. 1) in the alignment region (photosensitive region) of the unit pixel cells 13. This is because the unit pixel cells 13 are addressed for each row, and if the power source line 21 is provided in the row direction (horizontally), pixel driving currents in one row flow through a line, which results in large decline in voltage. The power source line 21 applies the same source-follower power-source voltage to the amplification transistors 10 of all the unit pixel cells 13.

The differential amplifiers 23 each correspond to one of the columns of the unit pixel cells 13. The output from the differential amplifiers 23 is connected to the drain regions of the reset transistors 11. When the address transistor 12 and the reset transistor 11 are conducted, the differential amplifier 23 receives the output from the address transistor 12, and performs a feedback operation such that the gate potential of the amplification transistor 10 is a constant feedback voltage (output voltage from the differential amplifier 23). Here, the output voltage from the differential amplifier 23 is 0 V or a positive voltage close to 0 V.

The feedback lines 24 each correspond to one of the columns of the unit pixel cells 13, and feed the output from the differential amplifier 23 back to the unit pixel cell 13 belonging to the corresponding one of the columns.

As to the solid-state imaging device having the above configuration, in the unit pixel cells 13 of a row selected by the vertical scanning unit 15, signal charges photo-electrically converted by the photoelectric conversion film units 9 are amplified by the amplification transistors 10, and are outputted to the vertical signal lines 17 through the address transistors 12. The outputted signals are stored in the column signal processing units 19 as electric signals, and then selected by and outputted from the horizontal signal read unit 20. Subsequently, signal charges in the unit pixel cells 13 which outputted signals are discharged when the reset transistors 11 are turned on. At the time, large thermal noises called kTC noises are generated from the reset transistors 11. The noises remain even when the reset transistors 11 are turned off and the storing of the signal charges is started. Therefore, to suppress the noises, the output from the vertical signal lines 17 is inverted and amplified by the differential amplifiers 23. The inverted and amplified signals are fed back to the drain regions of the reset transistors 11 through the feedback lines 24. This can suppress noises which generate in the reset transistors 11 by negative feedback control. The alternating-current (AC) components of the noises are fed back to the drain regions of the reset transistors 11, and the AC components are positive voltages close to 0 V as described above.

Figure 2:
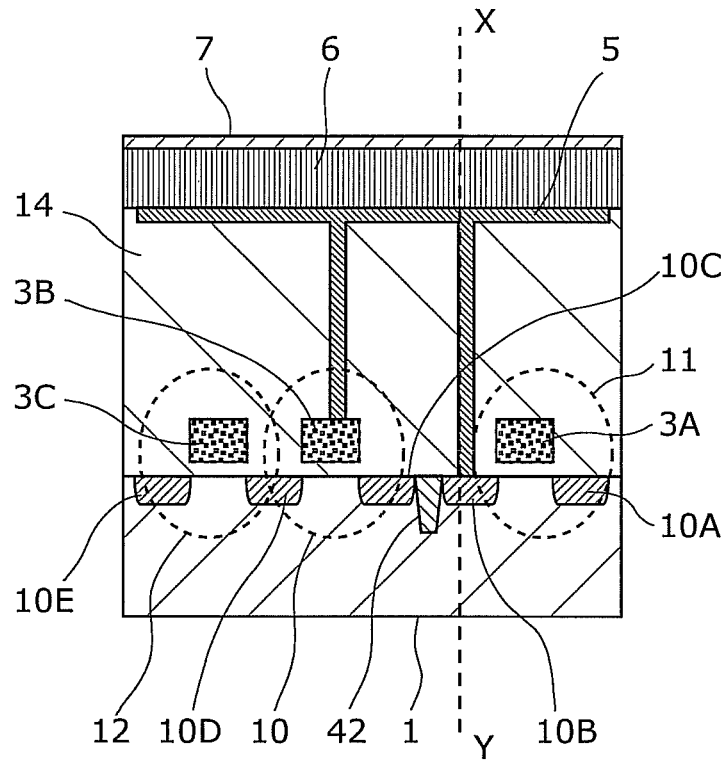
FIG. 2 is a cross-sectional view showing the schematic configuration of a unit pixel cell in a solid-state imaging device according to Embodiment 1.

FIG. 2 is a cross-sectional view showing the schematic configuration of a unit pixel cell 13 in a solid-state imaging device according to the present embodiment.

The unit pixel cell 13 includes a pixel circuit, an element isolation region 42 and the photoelectric conversion film unit 9. The pixel circuit includes three transistors: the address transistor 12, the amplification transistor 10, and the reset transistor 11 which are formed on a p-type silicon substrate 1 as a semiconductor substrate. The photoelectric conversion film unit 9 includes an interlayer insulating film 14, a pixel electrode 5, a photoelectric conversion film 6, and a transparent electrode 7 which are stacked in order above the silicon substrate 1.

In the unit pixel cell 13, the reset transistor 11 includes n-type impurity regions 10A and 10B formed in the silicon substrate 1 and a gate electrode 3A formed above the silicon substrate 1. Likewise, the amplification transistor 10 includes the n-type impurity regions 10C and 10D formed in the silicon substrate 1 and a gate electrode 3B formed above the silicon substrate 1. Furthermore, the address transistor 12 includes the n-type impurity regions 10D and 10E formed in the silicon substrate 1 and a gate electrode 3C formed above the silicon substrate 1.

The element isolation region 42 is formed in the silicon substrate 1, between the amplification transistor 10 and the reset transistor 11, and electrically isolates the amplification transistor 10 and the reset transistor 11.

While the impurity region 10A functions as the source region of the reset transistor 11, the impurity region 10B functions as the drain region of the reset transistor 11. In the solid-state imaging device in the present embodiment, an electron hole is used as a signal charge. Therefore, the source and the drain are reversed in the solid-state imaging device which uses an electron as a signal charge. The impurity region 10C functions as the drain region of the amplification transistor 10. The impurity region 10D functions as the source region of the amplification transistor 10 and the drain region of the address transistor 12. The impurity region 10E functions as the source region of the address transistor 12.

For instance, the impurity concentration in the silicon substrate 1 is $1 \times 10^{17}$ cm$^{-3}$. The impurity concentration in the n-type impurity regions 10A, 10B, 10C, 10D, and 10E ranges from $1 \times 10^{20}$ cm$^{-3}$ to $1 \times 10^{22}$ cm$^{-3}$. The film thickness of a gate insulating film below the gate electrodes 3A, 3B, and 3C is 6.5 to 10 nm.

The photoelectric conversion film 6 is, for example, made of amorphous silicon, is formed above the silicon substrate 1, and photo-electrically converts incident light. The pixel electrode 5 is formed on the surface of the photoelectric conversion film 6 on the side where the silicon substrate 1 is located, i.e., the pixel electrode 5 is formed between the silicon substrate 1 and the photoelectric conversion film 6. The pixel electrode 5 is in contact with the photoelectric conversion film 6, and collects signal charges generated by the photoelectric conversion film 6. The transparent electrode 7 is formed on the surface of the photoelectric conversion film 6 on the side opposite to the side of the silicon substrate 1, i.e., the transparent electrode 7 is formed on the photoelectric conversion film 6. To read signal charges in the photoelectric conversion film 6 to the pixel electrode 5, a positive constant voltage is applied to the photoelectric conversion film 6 through the photoelectric conversion film control line 16 and the transparent electrode 7.

The amplification transistor 10 is a MOS transistor formed on the silicon substrate 1 below the pixel electrode 5. The amplification transistor 10 includes the gate electrode 3B connected to the pixel electrode 5, and outputs a signal voltage according to the potential of the pixel electrode 5.

The reset transistor 11 is a MOS transistor formed on the silicon substrate 1 below the pixel electrode 5. The reset transistor 11 includes the gate electrode 3A and the drain region (impurity region 10B) which is formed in the silicon substrate 1, between the gate electrode 3A and the element isolation region 42, and is connected to the pixel electrode 5. The reset transistor 11 resets the potential of the gate electrode 3B of the amplification transistor 10 to a reset voltage (feedback voltage).

The address transistor 12 is a MOS transistor formed on the silicon substrate 1 below the pixel electrode 5. The address transistor 12 is formed between the amplification transistor 10 and the vertical signal line 17, and causes the unit pixel cell 13 to output a signal voltage to the vertical signal line 17. It should be noted that although the address transistor 12 is provided between the source region of the amplification transistor 10 and the vertical signal line 17, it may be provided between the drain region of the amplification transistor 10 and the power source line 21.

The pixel electrode 5 is connected through contacts to the gate electrode 3B of the amplification transistor 10 and the drain region of the reset transistor 11 (n-type impurity region 10B). The PN junction between the silicon substrate 1 and the n-type impurity region 10B connected to the pixel electrode 5 forms a parasitic diode (charge storage diode) for storing signal charges.

Figure 3:
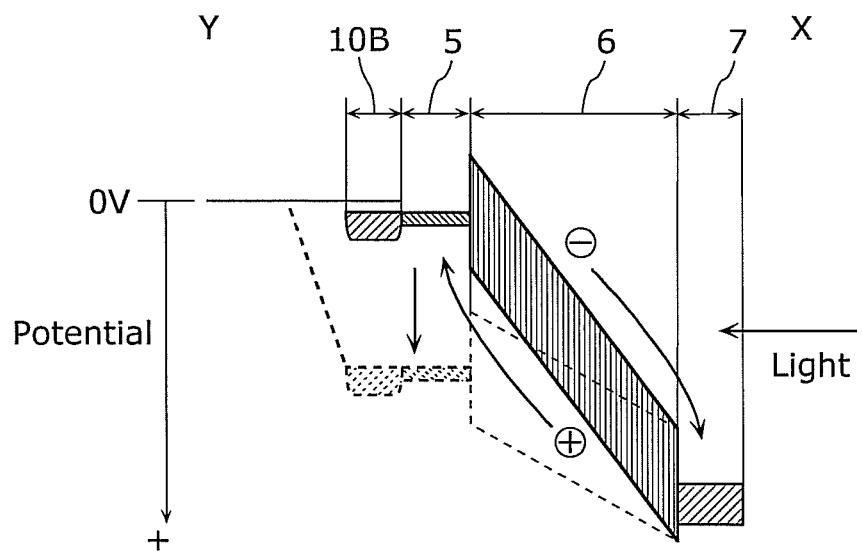
FIG. 3 shows the potential of a unit pixel cell according to Embodiment 1 (potential of the area along the line X-Y in FIG. 2).

FIG. 3 shows the potential of the unit pixel cell 13 (potential of the area along the line X-Y in FIG. 2).

A positive voltage is being applied to the transparent electrode 7. In the state where there is no signal (in a reset state), the n-type impurity region 10B which is a charge storage diode has a potential of almost 0 V with slightly reverse bias being applied. Here, the potential of the pixel electrode 5 and the potential of the n-type impurity region 10B are pulled to the positive potential side. Therefore, when the potential of the n-type impurity region 10B becomes a low potential close to 0 V in this state, a bias charge is injected into the n-type impurity region 10B. Therefore, the appropriate potential of the n-type impurity region 10B is around 0.1 V or above and a low reverse bias. The reason why the potential close to 0 V is set is to decrease a reverse leakage current (a dark current) flowing between the charge storage diode and the silicon substrate 1.

The light incident from above the transparent electrode 7 transmits through the transparent electrode 7, is incident on the photoelectric conversion film 6, and is converted into an electron-hole pair in the photoelectric conversion film 6. The electron of the electron-hole pair is transferred to the side of the transparent electrode 7 and to the photoelectric conversion film control line 16 connected to the transparent electrode 7. Meanwhile, the electron hole of the electron-hole pair is transferred to the side of the charge storage diode (n-type impurity region 10B) and stored therein. Therefore, the potential of the charge storage diode is changed to the positive potential side, and a voltage is applied between the charge storage diode and the silicon substrate 1. Here, a reverse leakage current (a dark current) flowing between the charge storage diode and the silicon substrate 1 leads to a flow noise. However, this is not a problem since the noise is less noticeable when there is a signal.

The voltage changed to the positive potential side due to electron holes stored in the charge storage diode is transferred to the gate electrode 3B of the amplification transistor 10. The signal amplified by the amplification transistor 10 transmits through the address transistor 12, and is outputted to the outside of the unit pixel cell 13, i.e., to the vertical signal line 17. Subsequently, signal charges stored in the charge storage diode are discharged by turning on the reset transistor 11. Here, the n-type impurity region 10B is reset to a voltage lower than the voltage being applied to the transparent electrode 7.

Figure 4:
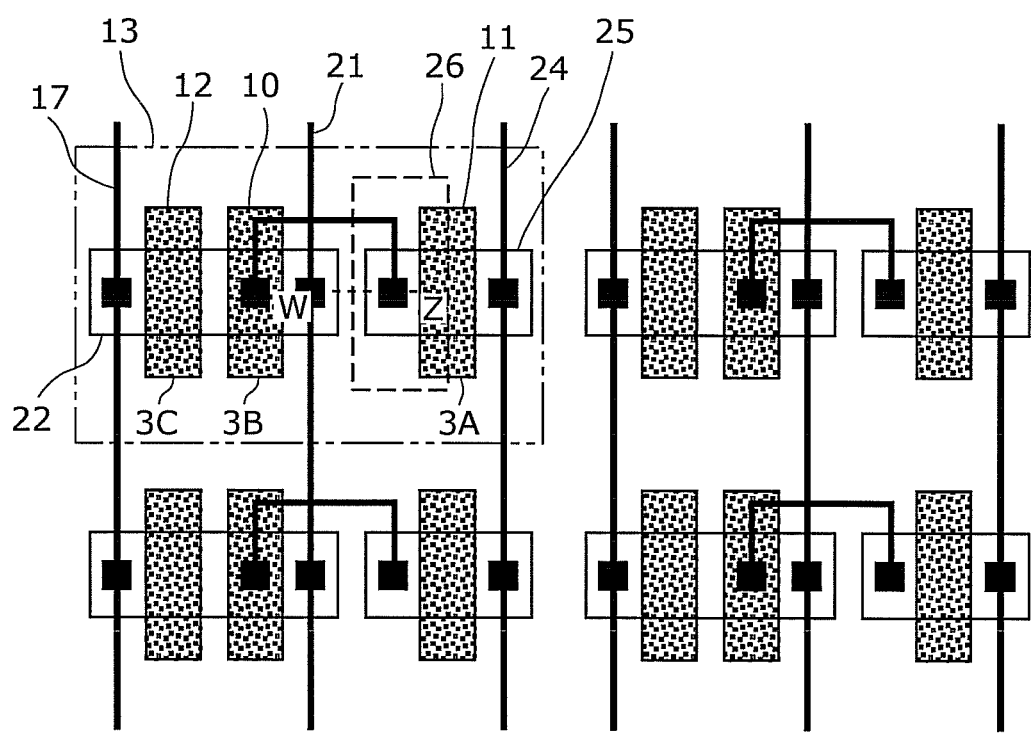
FIG. 4 is a plan view showing the configuration of four unit pixel cells according to Embodiment 1.

FIG. 4 is a plan view showing the configuration of the unit pixel cells 13.

In the unit pixel cell 13, the active regions of the amplification transistor 10 and the address transistor 12 are formed in a first active region 22 formed in the silicon substrate 1. The active region of the reset transistor 11 is formed in a second active region 25 formed in the silicon substrate 1. The active regions are a source region, a drain region, and a gate region (channel region).

The vertical signal line 17 is connected to the source region of the address transistor 12. The power source line 21 is connected to the drain region of the amplification transistor 10. The drain region of the reset transistor 11 and the gate electrode of the amplification transistor 10 are electrically connected. The drain region of the reset transistor 11 and the gate electrode of the amplification transistor 10 are connected to the pixel electrode 5 above the silicon substrate 1. The reset transistor 11 is formed in the second active region 25 which is electrically isolated from the first active region 22. The source region of the reset transistor 11 is connected to the feedback line 24. Here, the region where the issue of leakage current arises is a reset-transistor-drain surrounding region 26 which surrounds the drain region of the reset transistor 11.

An element isolation STI for electrically isolating the second active region 25 and the first active region 22 is formed in the silicon substrate 1, between the second active region 25 and the first active region 22.

Figure 5:
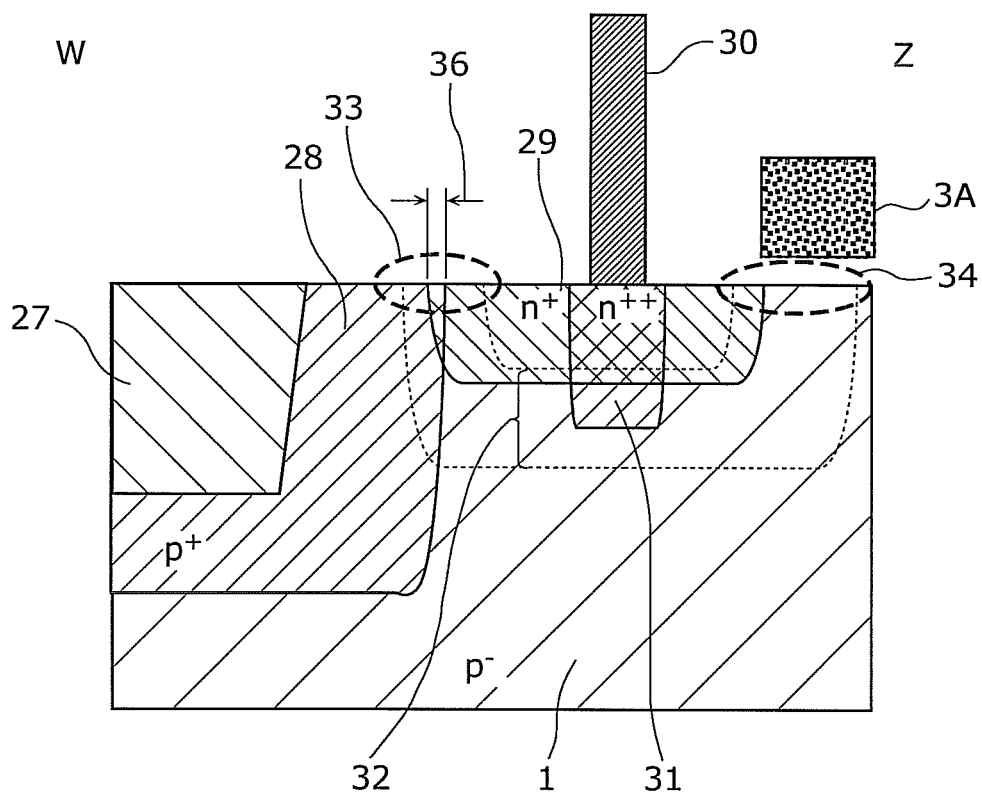
FIG. 5 is a cross-sectional view of a unit pixel cell according to Embodiment 1 (cross-sectional view of the area along the line W-Z in FIG. 4).

FIG. 5 is a cross-sectional view of the unit pixel cell 13 (cross-sectional view of the area along the line W-Z in FIG. 4).

The unit pixel cell 13 includes, in the silicon substrate 1, an element isolation STI27, a p-type leakage suppression region 28, an n-type extension region 29, and an n-type contact region 31. The element isolation STI 27 forms the element isolation region 42 which is formed in the silicon substrate 1, between the amplification transistor 10 and the reset transistor 11.

The element isolation STI27 is a trench formed in the silicon substrate 1, and electrically isolates the amplification transistor 10 and the reset transistor 11.

The leakage suppression region 28 is formed in the silicon substrate 1, between the extension region 29 and the element isolation STI27. The leakage suppression region 28 is in contact with the extension region 29 and the element isolation STI27, and electrically isolates the amplification transistor 10 and the reset transistor 11. The impurity concentration of the leakage suppression region 28 is higher than that of the silicon substrate 1, and lower than that of the extension region 29.

The drain region of the reset transistor 11 (impurity region 10B) includes the extension region 29 and the contact region 31 electrically connected to the pixel electrode 5 through a line contact electrode 30. Part of the extension region 29 is a region between (i) the element isolation STI27 and the leakage suppression region 28 and (ii) the contact region 31. The extension region 29 has an impurity concentration lower than the contact region 31. The extension region 29 is in contact with the contact region 31.

The surrounding of the drain region of the reset transistor 11 is the p-type region in the silicon substrate 1. The depletion layer 32 shown by the dotted line is present between the drain region of the reset transistor 11 and its surrounding region. The leakage current occurs in the depletion layer 32. There are two parts where a leakage current is large in the depletion layer 32. The two parts are the places where the surface of the silicon substrate 1 and the depletion layer 32 are in contact, i.e., an element-isolation depletion region 33 and an undergate depletion region 34.

Figure 6:
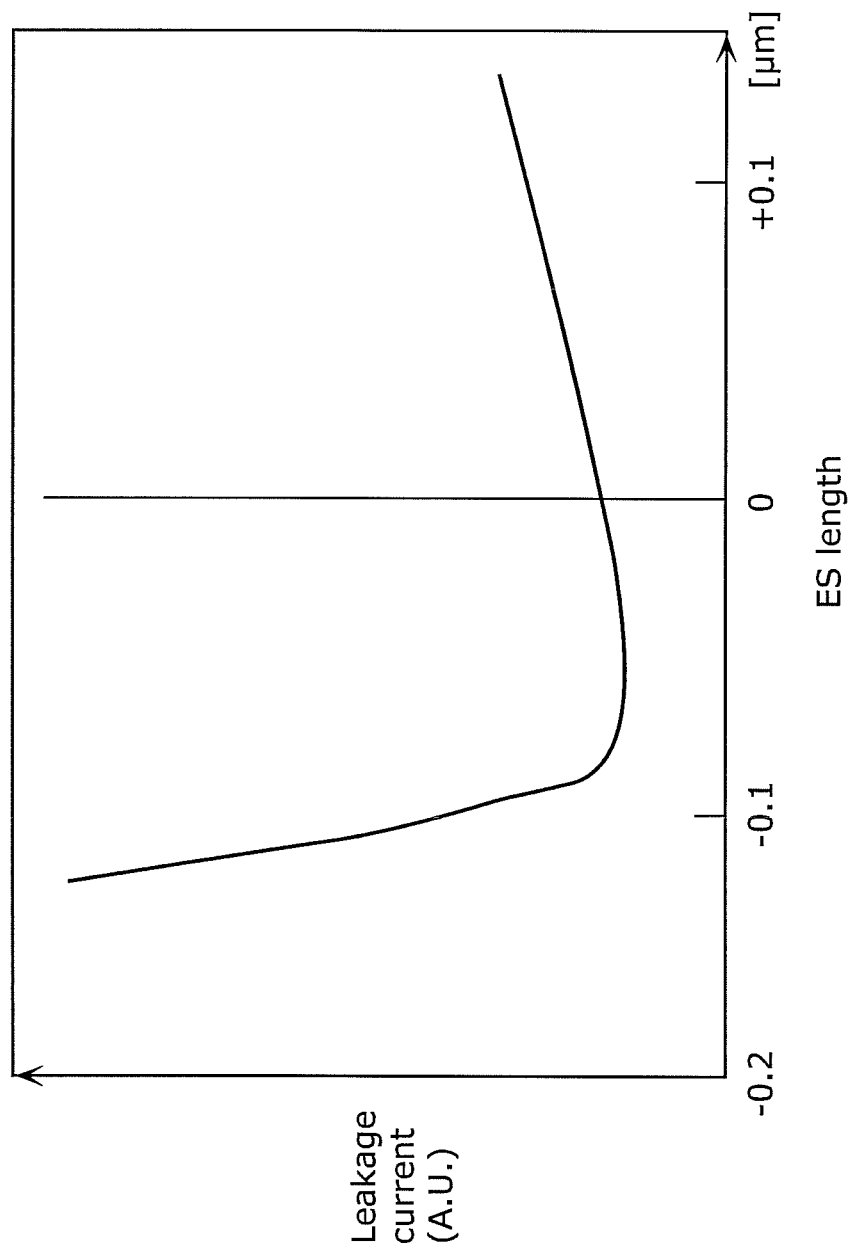
FIG. 6 shows the relationship between (i) the distance between an extension region and a leakage suppression region and (ii) a leakage current.

Generally, the impurity concentration of the extension region 29 forming the drain region of the reset transistor 11 is lower than that of the contact region 31, but higher than that of the leakage suppression region 28. Since the depletion layer 32 is on the low impurity concentration side, the element-isolation depletion region 33 is on the side where the leakage suppression region 28 is located. Therefore, when the distance between the extension region 29 and the leakage suppression region 28 is shortened, the element-isolation depletion region 33 becomes smaller. This reduces leakage current. When an ES length 36 is the distance between the edge of the extension region 29 (edge on the side where the element isolation STI27 is located) and the edge of the leakage suppression region 28 (edge on the side where the gate electrode 3A is located), the relationship between the ES length 36 and the leakage current is as shown in FIG. 6. As shown in FIG. 6, the leakage current decreases with the decreases in the ES length. Even when the ES length falls within the range of negative values, i.e., the extension region 29 and the leakage suppression region 28 are overlapped, there is a range where the leakage current further decreases. When the impurity concentration of the extension region 29 is low, even if the two regions are overlapped, there is a range where the leakage current decreases. However, further expansion of the overlapped region leads to the breakdown of the PN junction, and rapidly increases in the leakage current.

Therefore, in order to reduce the leakage current, the extension region 29 is at least in contact with the leakage suppression region 28, and is overlapped so as not to lead to the breakdown. Accordingly, the depletion layer 32 which is formed by the PN junction between the drain region and its surrounding region and is in contact with the surface of the silicon substrate 1 (PN junction in the element-isolation depletion region 33) is narrower than the depletion layer 32 formed by the PN junction between the drain region and its surrounding region and formed in the silicon substrate 1. For example, the depletion layer 32 in the element-isolation depletion region 33 is narrower than the depletion layer 32 formed by the PN junction between the bottom of the extension region 29 and the silicon substrate 1.

Here, the PN junction between the drain region and its surrounding region and in contact with the surface of the silicon substrate 1 (PN junction in the element-isolation depletion region 33) is formed between the edge of the extension region 29 (edge on the side where the element isolation STI27 is located) and the edge of the leakage suppression region 28 (edge on the side where the gate electrode 3A is located).

Thus, according to the solid-state imaging device in the present embodiment, the width of the depletion layer 32 which is formed by the PN junction portion in the element-isolation depletion region 33 and is in contact with the surface of the silicon substrate 1 is narrowed. Therefore, it is possible to reduce leakage current which occurs in the PN junction portion in contact with the surface of the silicon substrate 1.

Moreover, since the element isolation is doubly performed in the element isolation STI27 and the leakage suppression region 28, the leakage current can be further reduced.

Embodiment 2

Figure 7:
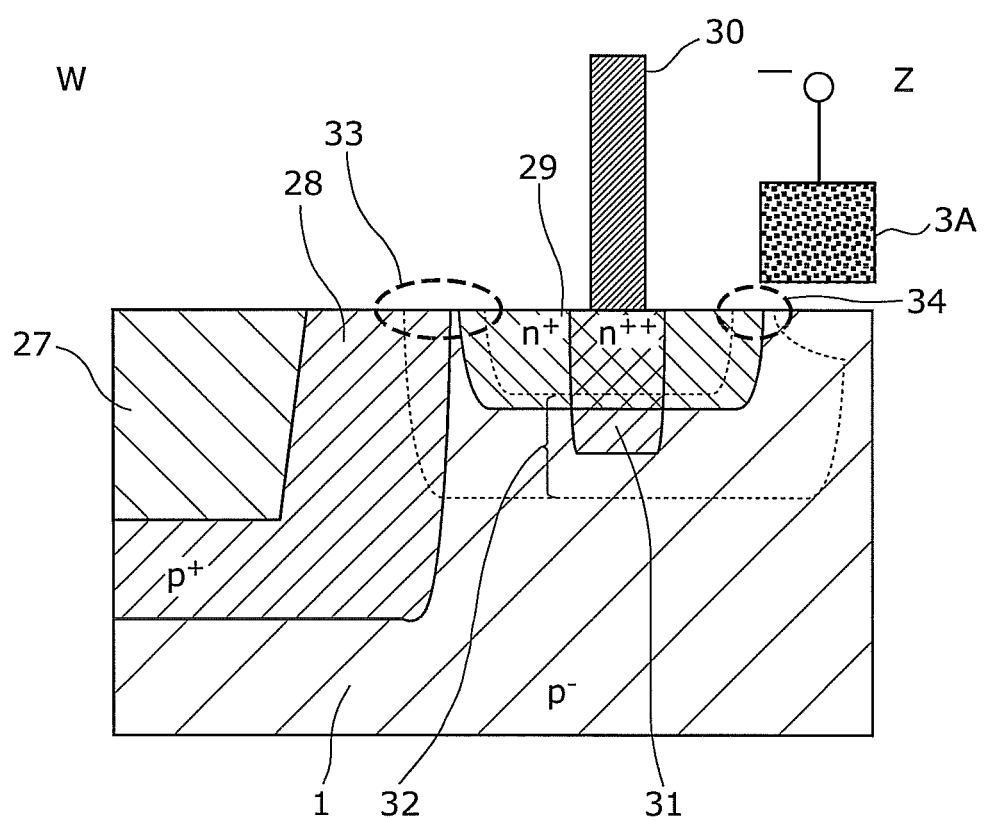
FIG. 7 is a cross-sectional view of a unit pixel cell in a solid-state imaging device according to Embodiment 2.

FIG. 7 is a cross-sectional view of a unit pixel cell 13 in a solid-state imaging device according to Embodiment 2. The following mainly describes a difference from the solid-state imaging device in Embodiment 1.

The solid-state imaging device in the present embodiment differs from the solid-state imaging device in Embodiment 1 in that when a reset transistor 11 is in OFF state, a gate electrode 3A of the reset transistor 11 has a negative potential relative to the potential of a silicon substrate 1.

The region in the silicon substrate 1 below the gate electrode 3A has a low impurity concentration. Therefore, in FIG. 5, a depletion region 32 in an under-gate depletion region 34 is wider than the depletion region in an element-isolation depletion region 33. This means that the leakage current which occurs in the under-gate depletion region 34 is large. However, in FIG. 7, a negative potential is applied to the gate electrode 3A to suppress the leakage current which occurs in the under-gate depletion region 34. The application of the negative potential to the gate electrode 3A induces electron holes on the surface of the silicon substrate 1 below the gate electrode 3A. The depletion layer 32 in the under-gate depletion region 34 is narrowed and the leakage current is reduced. Since the reset transistor 11 is in OFF state most of the time, it is very effective for the reduction of the leakage current to apply a negative potential when the reset transistor 11 is in OFF state.

Accordingly, the depletion layer 32 which is formed by the PN junction between the drain region and its surrounding region and is in contact with the surface of the silicon substrate 1 (PN junction in the under-gate depletion region 34) is narrower than the depletion layer 32 formed by the PN junction between the drain region and its surrounding region and formed in the silicon substrate 1. For example, the depletion layer 32 in the under-gate depletion region 34 is narrower than the depletion layer 32 formed by the PN junction between the bottom of the extension region 29 and the silicon substrate 1.

Here, the PN junction between the drain region and its surrounding region and in contact with the silicon substrate 1 (PN junction in the under-gate depletion region 34) is formed between the edge of the extension region 29 (edge on the side where gate electrode 3A is located) and the silicon substrate 1.

Thus, according to the solid-state imaging device in the present embodiment, electron holes are accumulated in the silicon substrate 1 below the gate electrode 3A to which a negative potential has been applied. This narrows the width of the depletion layer 32 formed by the PN junction portion in the under-gate depletion region 34. As a result, it is possible to reduce the leakage current which occurs due to the PN junction portion in contact with the surface of the silicon substrate 1.

Embodiment 3

Figure 8:
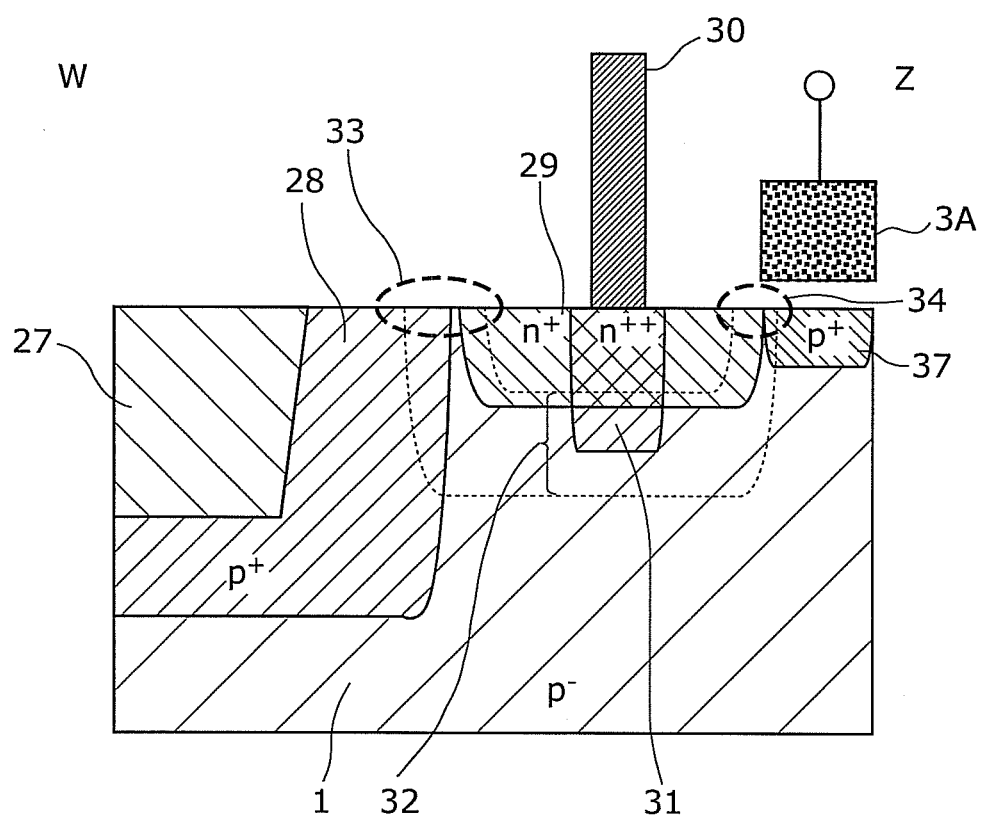
FIG. 8 is a cross-sectional view of a unit pixel cell in a solid-state imaging device according to Embodiment 3.

FIG. 8 is a cross-sectional view of a unit pixel cell 13 in a solid-state imaging device according to Embodiment 3. The following only describes a difference from the solid-state imaging device in Embodiment 1.

The solid-state imaging device in the present embodiment differs from the solid-state imaging device in Embodiment 1 in that a reset transistor 11 has, as a part of a channel region, a p-type channel control region 37 which is formed in the silicon substrate 1 below a gate electrode 3A, and has a higher impurity concentration than a silicon substrate 1.

In FIG. 8, the channel control region 37 is provided below the gate electrode 3A to narrow a depletion layer 32 in an under-gate depletion region 34. In this case, the threshold voltage of the reset transistor 11 is higher than those of other transistors in the same unit pixel cell 13, i.e., the amplification transistor 10 and the address transistor 12. However, this is not a problem since the source region and the drain region of the reset transistor 11 are operated at around 0 V as described above.

Accordingly, the depletion layer 32 which is formed by the PN junction between the drain region and its surrounding region and is in contact with the surface of the silicon substrate 1 (PN junction in the under-gate depletion region 34) is narrower than the depletion layer 32 formed by the PN junction between the drain region and its surrounding region and formed in the silicon substrate 1. For example, the depletion layer 32 in the under-gate depletion region 34 is narrower than the depletion layer 32 formed by the PN junction between the bottom of the extension region 29 and the silicon substrate 1.

Here, the PN junction which is between the drain region and its surrounding region and in contact with the surface of the silicon substrate 1 (PN junction in the under-gate depletion region 34) is formed between (i) the edge of the extension region 29 (edge on the side where gate electrode 3A is located) and (ii) the under-gate depletion region 34 or the silicon substrate 1.

Thus, according to the solid-state imaging device in the present embodiment, the channel control region 37 can suppress the expansion of the depletion layer formed by the PN junction portion in the under-gate depletion region 34. As a result, it is possible to reduce the leakage current which occurs due to the PN junction portion in contact with the surface of the silicon substrate 1.

It should be noted that in the present embodiment, the extension region 29 may be in contact with or spaced apart from the under-gate depletion region 34.

Embodiment 4

Figure 9:
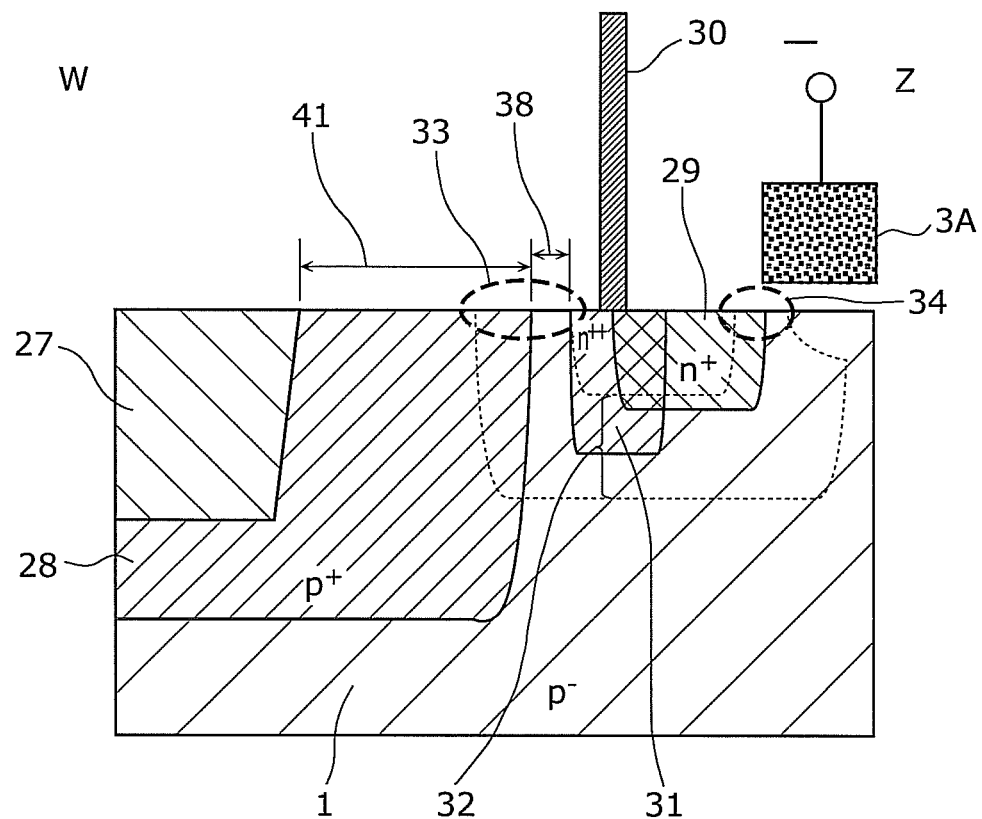
FIG. 9 is a cross-sectional view of a unit pixel cell in a solid-state imaging device according to Embodiment 4.

FIG. 9 is a cross-sectional view of a unit pixel cell 13 in a solid-state imaging device according to Embodiment 4. The following only describes a difference from the solid-state imaging device in Embodiment 2.

The solid-state imaging device in the present embodiment differs from the solid-state imaging device in Embodiment 2 in the following point. The extension region 29 is between the contact region 31 and the gate electrode 3A, but is not between the contact region 31 and the leakage suppression region 28. The PN junction which is between the drain region and its surrounding region and in contact with the surface of the silicon substrate 1 (PN junction in the element-isolation depletion region 33) is formed between the edge of the contact region 31 (edge on the side where the element isolation STI27 is located) and the silicon substrate 1.

The leakage suppression region 28 is formed in the silicon substrate 1, between the contact region 31 and the element isolation STI27, is spaced apart from the contact region 31, and is in contact with the element isolation STI27.

The extension region 29 is provided to prevent part of the contact region 31 of high concentration from spreading into the region below the gate electrode 3A. Therefore, the extension region 29 does not have to extend out of the contact region 31 to the side of element isolation STI27 (left direction in FIG. 9). Accordingly, in FIG. 9, the extension region 29 is formed such that the edge of the extension region 29 (edge on the side where the element isolation STI27 is located) is inside the contact region 31. This decreases the area of the drain region itself of the reset transistor 11 made up of the extension region 29 and the contact region 31, resulting in decrease in the leakage current.

Figure 10:
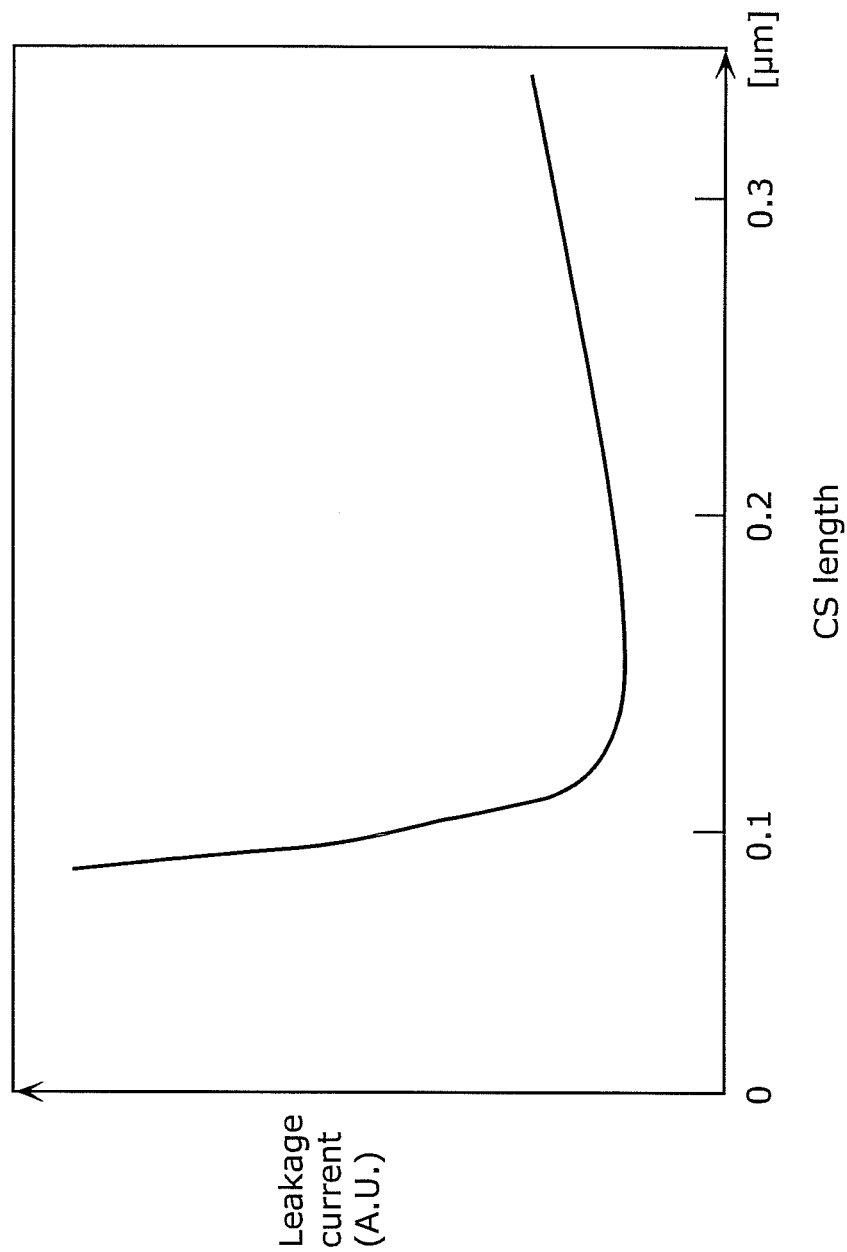
FIG. 10 shows the relationship between (i) the distance between a contact region and a leakage suppression region and (ii) a leakage current.

Here, when a CS length 38 is the distance between the edge of the contact region 31 (edge on the side where the element isolation STI27 is located) and the edge of the leakage suppression region 28 (edge on the side where the gate electrode 3A is located), the relationship between the CS length 38 and the leakage current is as shown in FIG. 10. As shown in FIG. 10, as the CS length 38 becomes shorter, the element-isolation depletion region 33 becomes narrower. Therefore, the leakage current decreases. However, when the CS length 38 is 0.1 µm or less, the leakage current rapidly increases due to the breakdown of the PN junction. Therefore, the contact region 31 and the leakage suppression region 28 are spaced apart so as not to be overlapped. The breakdown is suppressed with a high possibility by setting the CS length 38 to be greater than 0.1 µm, for example, 0.15 µm.

Figure 11:
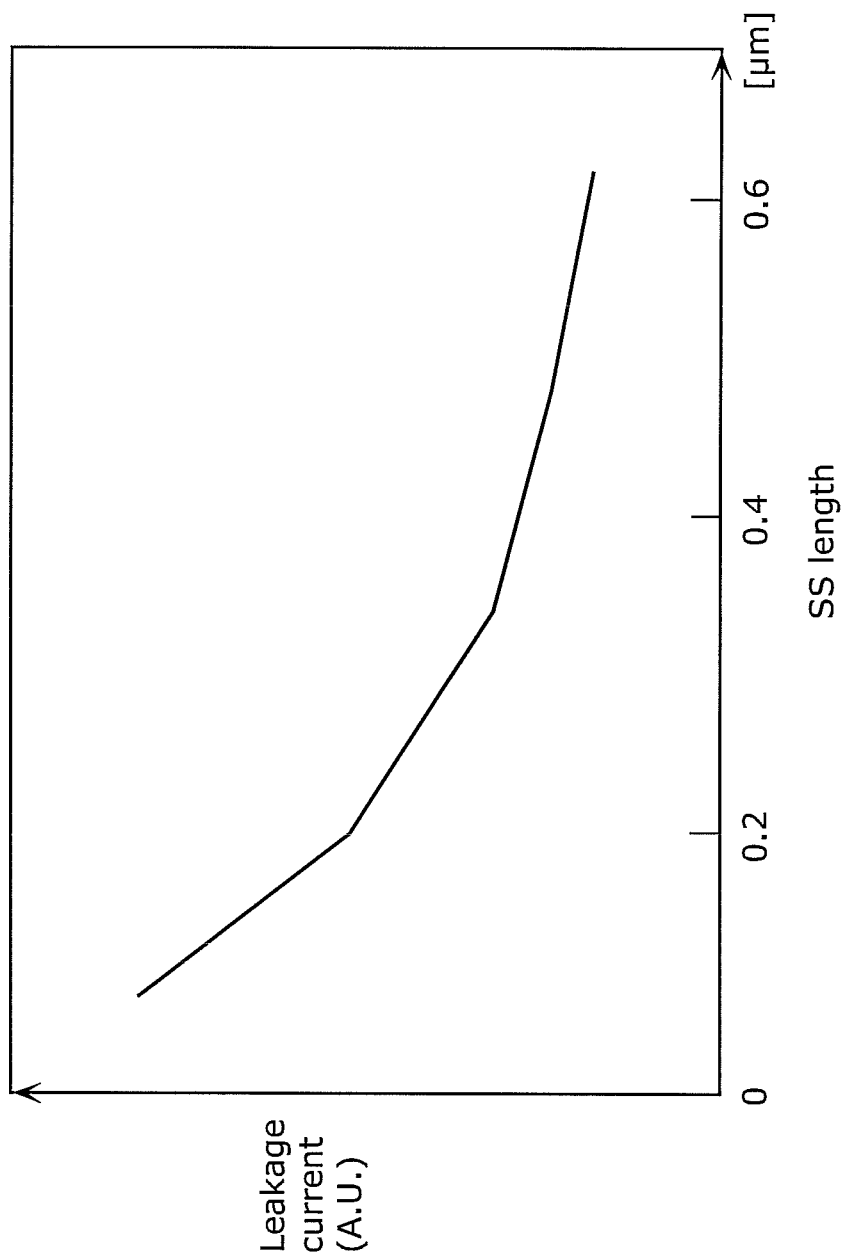
FIG. 11 shows the relationship between (i) the distance between an element isolation STI and a leakage suppression region and (ii) a leakage current.

Moreover, since the element isolation STI27 is formed by embedding into the silicon substrate 1, a large stress is applied, and this stress increases the leakage current. Therefore, as shown in FIG. 11, the leakage current decreases with the increase in a SS length 41 in FIG. 9 (distance from the edge of the element isolation STI27 (edge on the side where the gate electrode 3A is located) to the edge of the leakage suppression region 28 (edge on the side where the gate electrode 3A is located). Therefore, the position of the leakage suppression region 28 is determined so that the SS length 41 is long.

Figure 12:
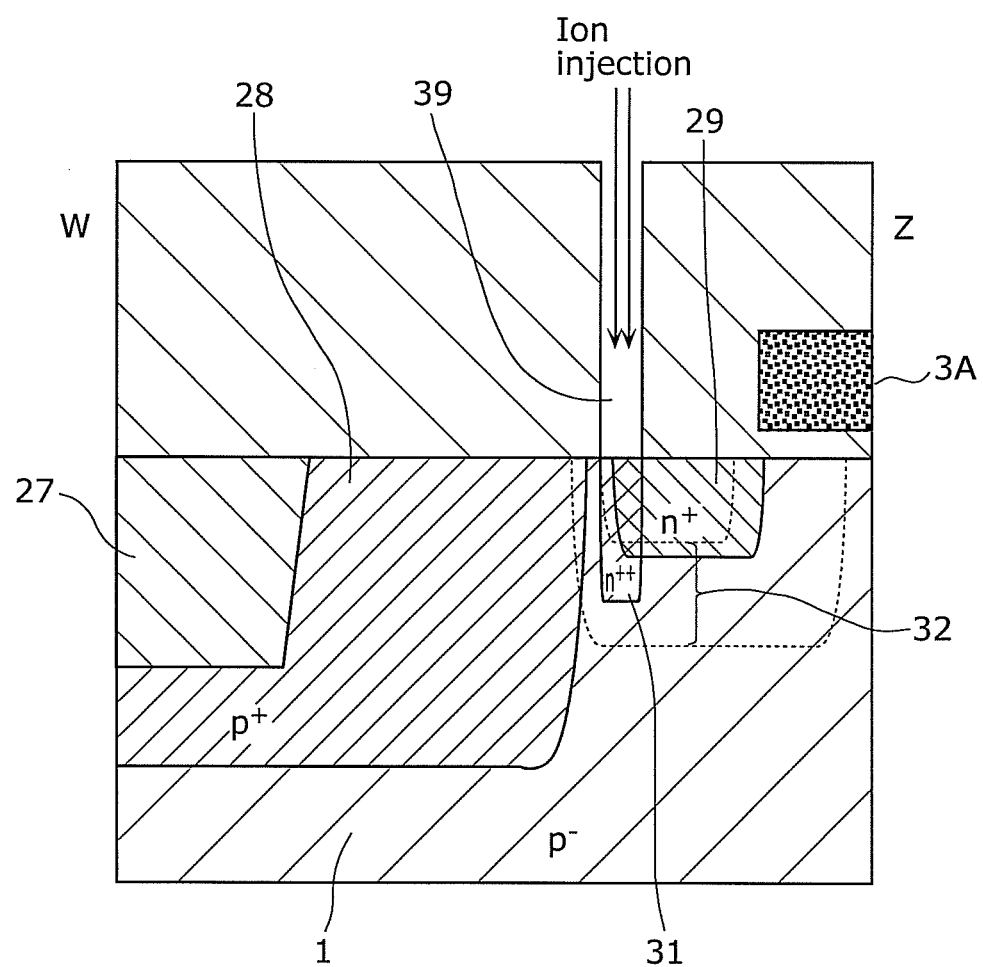
FIG. 12 is a cross-sectional view for explaining a method of fabricating a solid-state imaging device according to Embodiment 4 (method of forming a contact region).

FIG. 12 is a cross-sectional view for explaining a method of fabricating a solid-state imaging device according to the present embodiment (method of forming the contact region 31).

In FIG. 12, in order to form a line contact electrode 30, ion injection of n-type impurity is performed by a self-aliment technique to form the contact region 31, using a contact hole 39 formed in a mask on the silicon substrate 1. This can form a small contact region 31. Moreover, since the contact region 31 can be formed using the contact region of another transistor of the image sensor and another mask (in the ion injection process), it is possible to set the conditions of the ion injection for forming the contact region 31 such that the leakage current is the smallest.

Thus, according to the solid-state imaging device in the present embodiment, the distance between the contact region and the leakage suppression region can be shortened without contact. Therefore, it is possible to narrow the width of the depletion layer 32 which is formed by the PN junction portion in the element-isolation depletion region 33 and is in contact with the surface of the silicon substrate 1. As a result, it is possible to reduce the leakage current which occurs due to the PN junction portion in contact with the surface of the silicon substrate 1, while suppressing the breakdown of the PN junction.

Embodiment 5

Figure 13:
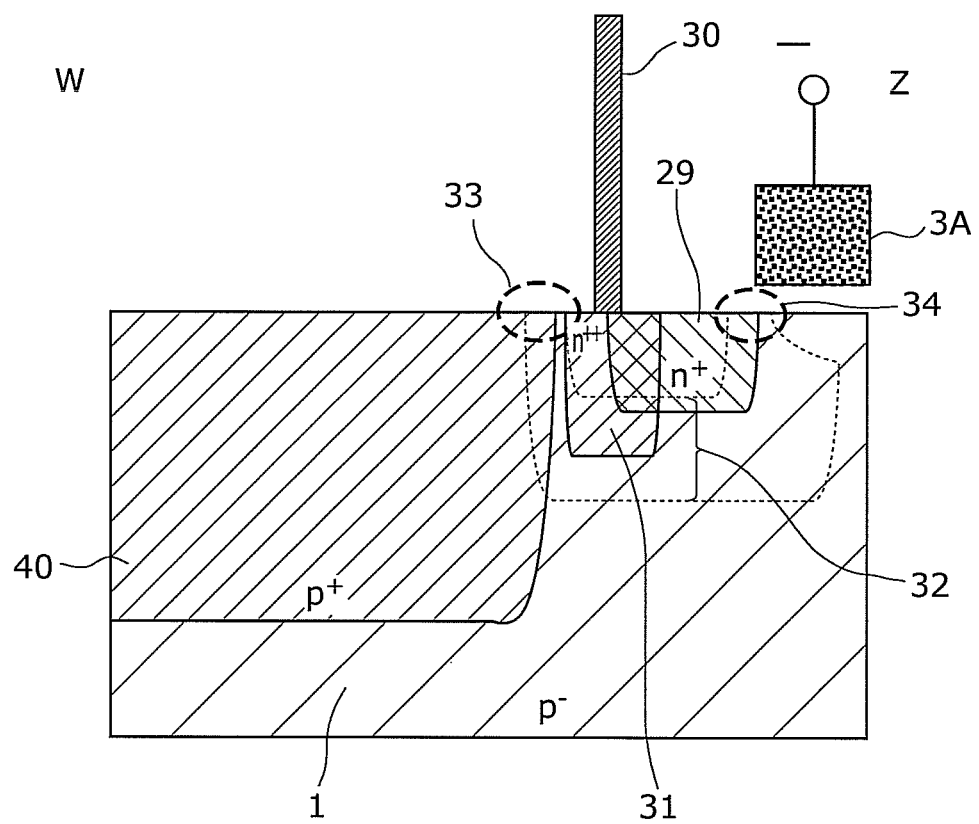
FIG. 13 is a cross-sectional view of a unit pixel cell in a solid-state imaging device according to Embodiment 5.

FIG. 13 is a cross-sectional view of a unit pixel cell 13 in a solid-state imaging device according to Embodiment 5. The following only describes a difference from the solid-state imaging device in Embodiment 4.

The solid-state imaging device in the present embodiment differs from the solid-state imaging device in Embodiment 4 in the following point. The element isolation region 42 is made of, instead of the element isolation STI27 and the leakage suppression region 28, a p-type isolation region 40 which is formed in the silicon substrate 1 and has a higher impurity concentration than the silicon substrate 1. In the unit pixel cell 13, the reset transistor 11 is electrically isolated from other transistors.

Since the STI is formed by embedding into the silicon substrate 1, a large stress is applied, and this stress increases the leakage current. Therefore, in FIG. 13, the reset transistor 11, i.e., a transistor in the unit pixel cell 13 is isolated not by the STI, but only by the isolation region 40. This decreases leakage current.

Here, the STI is used for isolating a transistor in a peripheral circuit except the unit pixel cell 13.

Thus, according to the solid-state imaging device in the present embodiment, the element isolation in the unit pixel cell 13 is realized only with the impurity region (only with the element isolation by the PN junction). Therefore, compared to the STI structure, the leakage current caused by the stress when embedding into the silicon substrate 1 can be better suppressed. This can decrease the leakage current.

Embodiment 6

Figure 14:
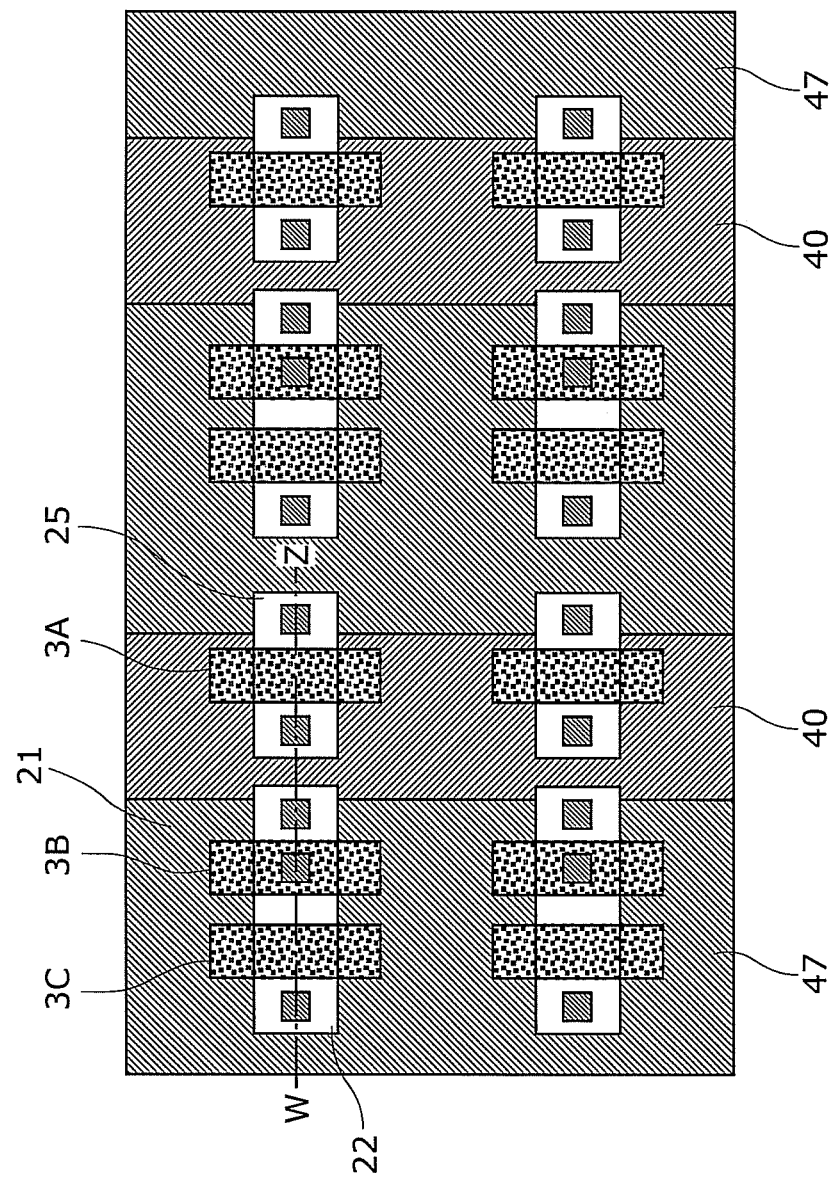
FIG. 14 is a plan view showing the configuration of unit pixel cells in a solid-state imaging device according to Embodiment 6.
Figure 15:
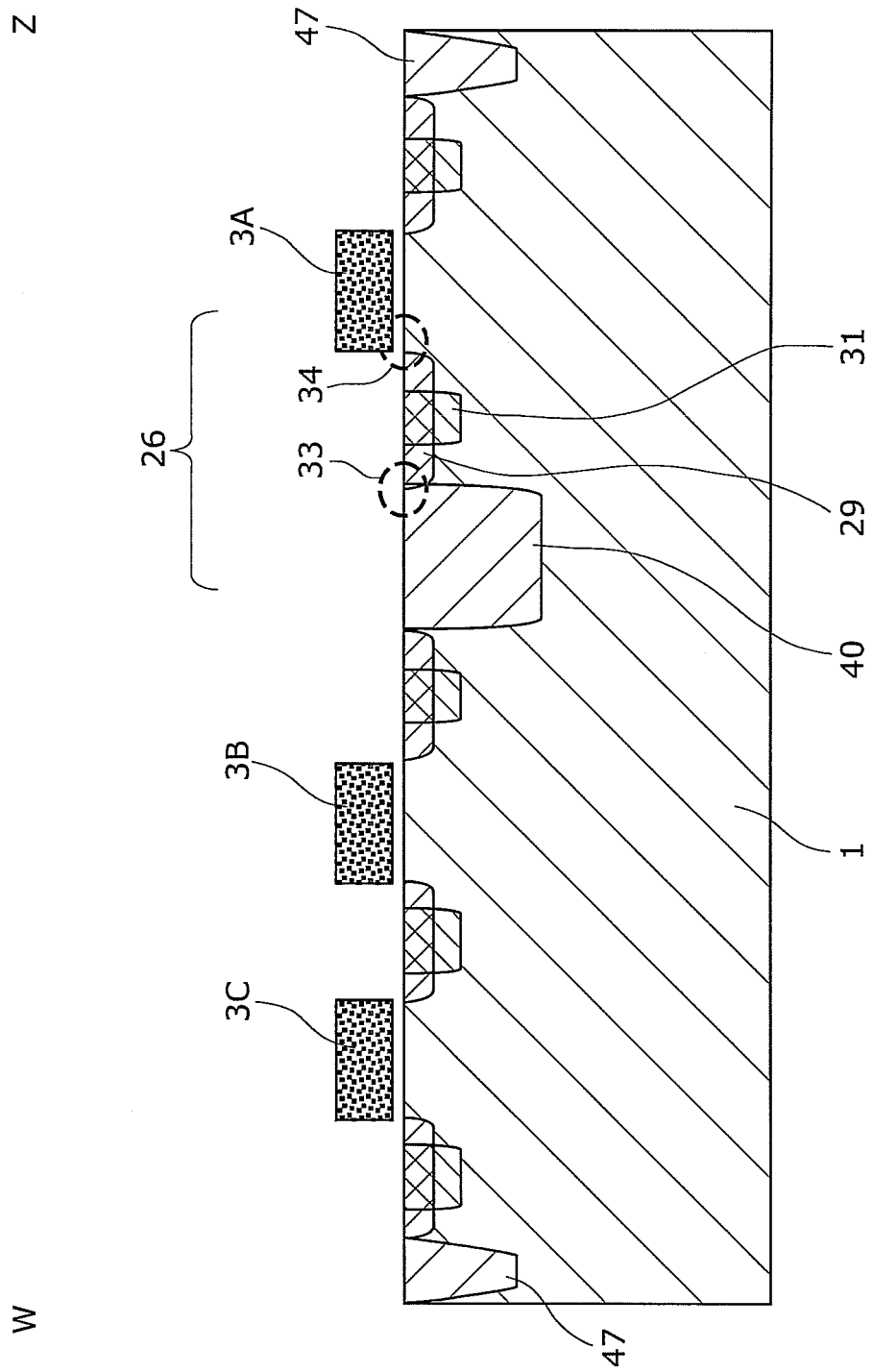
FIG. 15 is a cross-sectional view of a unit pixel cell in a solid-state imaging device according to Embodiment 6 (cross-sectional view of the area along the line W-Z in FIG. 14).

FIG. 14 is a plan view showing the configuration of unit pixel cells 13 in a solid-state imaging device according to Embodiment 6. FIG. 15 is a cross-sectional view of the unit pixel cell 13 in the solid-state imaging device (cross-sectional view in an area along the line W-Z in FIG. 14). The following only describes a difference from the solid-state imaging device in Embodiment 1.

The solid-state imaging device in the present embodiment differs from the solid-state imaging device in Embodiment 1 in the following point. The element isolation region 42 is made of, instead of the element isolation STI27 and the leakage suppression region 28, a p-type isolation region 40 which is formed in the silicon substrate 1 and has a higher impurity concentration than the silicon substrate 1. In the unit pixel cell 13, the reset transistor 11 is electrically isolated from other transistors.

Moreover, the solid-state imaging device in the present embodiment differs from the solid-state imaging device in Embodiment 1 in the following point. The solid-state imaging device in the present embodiment further includes an element isolation STI47 for electrically isolating two adjacent unit pixel cells 13 which is made of a trench formed in the silicon substrate 1, between the two adjacent unit pixel cells 13.

Electrical isolation is performed by the isolation region 40 without forming the STI only in a reset-transistor-drain surrounding region 26 which surrounds the drain region of the reset transistor 11 especially affected by a leakage current in the unit pixel cell 13, i.e., without using the STI only for the electrical isolation of the reset transistor 11 in the unit pixel cell 13. The other element isolation is performed by the element isolation STI47. That is, both the element isolation by the STI and the element isolation by the impurity region are used for element isolation in one solid-state imaging device. The element isolation STI47 is a trench.

In order to reduce the leakage current, the extension region 29 is at least in contact with the isolation region 40, and is overlapped so as not to lead to the breakdown. Accordingly, the depletion layer which is formed by the PN junction between the drain region and its surrounding region and is in contact with the surface of the silicon substrate 1 (PN junction in the element-isolation depletion region 33) is narrower than the depletion layer formed by the PN junction between the drain region and its surrounding region and formed in the silicon substrate 1. For example, the depletion layer in the element-isolation depletion region 33 is narrower than the depletion layer formed by the PN junction between the bottom of the extension region 29 and the silicon substrate 1.

Here, the PN junction which is between the drain region and its surrounding region and in contact with the surface of the silicon substrate (PN junction in the element-isolation depletion region 33) is formed between the edge of the extension region 29 (edge on the side where the isolation region 40 is located) and the isolation region 40.

Thus, according to the solid-state imaging device in the present embodiment, the element isolation in the unit pixel cell 13 is realized only with the impurity region. Therefore, when compared to the STI structure, the leakage current caused by the stress when embedding into the silicon substrate 1 can be suppressed. This can reduce the leakage current.

Embodiment 7

Figure 16:
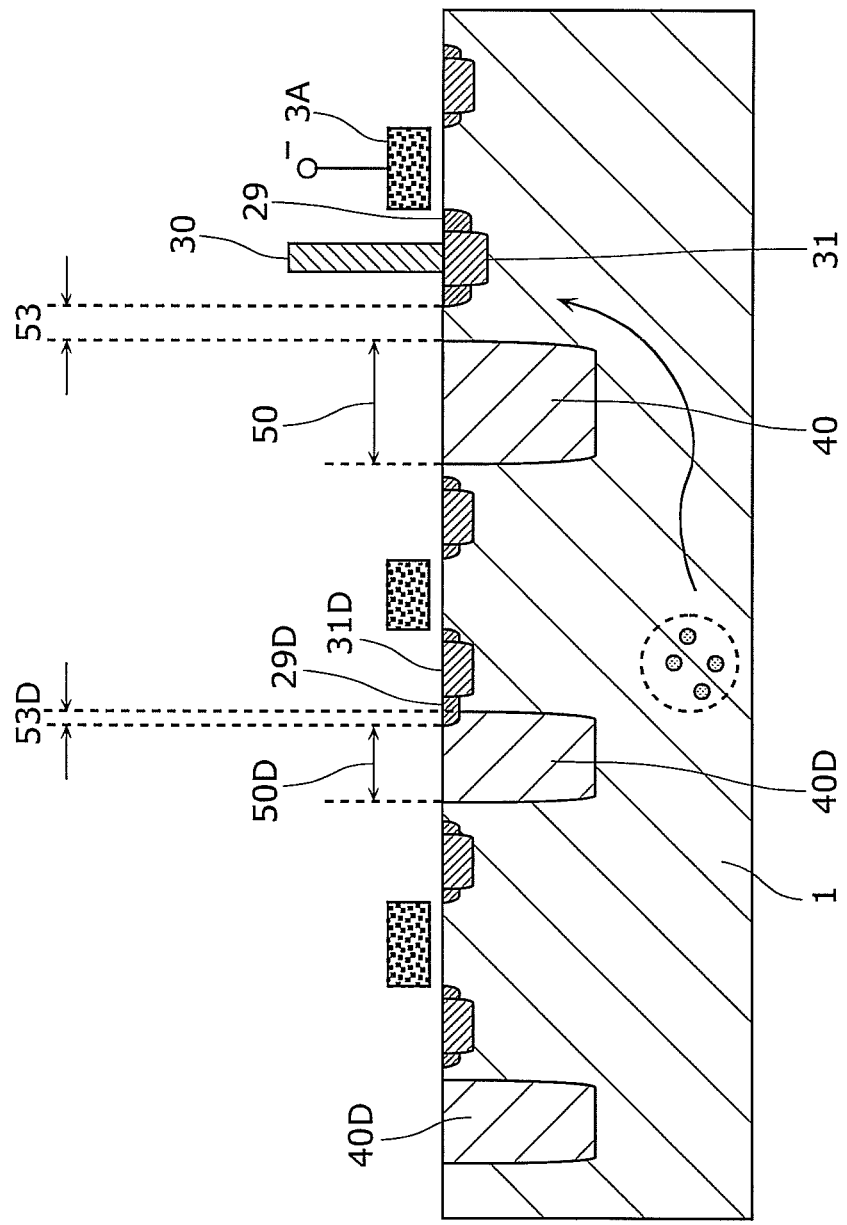
FIG. 16 is a cross-sectional view of a unit pixel cell in a solid-state imaging device according to Embodiment 7.

FIG. 16 is a cross-sectional view of a unit pixel cell 13 in a solid-state imaging device according to Embodiment 7. The following only describes a difference from the solid-state imaging device in Embodiment 2.

The solid-state imaging device in the present embodiment differs from the solid-state imaging device in Embodiment 2 in the following point. The element isolation region 42 is made of, instead of the element isolation STI27 and the leakage suppression region 28, a p-type isolation region 40 which is formed in the silicon substrate 1 and has a higher impurity concentration than the silicon substrate 1. In the unit pixel cell 13, the reset transistor 11 is electrically isolated from other transistors. This is as same as Embodiment 5.

Moreover, FIG. 16 shows that the solid-state imaging device in the present embodiment differs from the solid-state imaging device in Embodiment 2 in the following point. In the unit pixel cell 13, in order to reduce the leakage current, the source or drain region of a transistor other than the reset transistor 11 is formed to be shallower than the drain region of the reset transistor 11 with which the line contact electrode 30 connected to the pixel electrode 5 is in contact. Specifically, in the unit pixel cell 13, a contact region 31D of the source or drain region of a transistor other than the reset transistor 11 is formed to be shallower than a contact region 31 of the drain region of the reset transistor 11. An extension region 29D of the source or drain region of a transistor other than the reset transistor 11 is formed to be shallower than an extension region 29 of the drain region of the reset transistor 11. This is also different from Embodiment 2.

Furthermore, FIG. 16 shows that the solid-state imaging device in the present embodiment differs from the solid-state imaging device in Embodiment 2 in the following point. A distance 53D between (i) the extension region 29D of the source or drain region of a transistor other than the reset transistor 11 and (ii) an adjacent isolation region 40D is shorter than a distance 53 between the extension region 29 of the drain region of the reset transistor 11 and the adjacent region 40. Specifically, the contact region 31D or the extension region 29D of the source or drain region of a transistor other than the reset transistor 11 is overlapped with the isolation region 40D. This is also different from the solid-state imaging device in Embodiment 2.

Moreover, FIG. 16 shows that the solid-state imaging device in the present embodiment differs from the solid-state imaging device in Embodiment 2 in the following point. A width 50D of the isolation region 40D adjacent to the extension region 29D of the source or drain region of a transistor other than the reset transistor 11 is narrower than a width 50 of the isolation region 40 adjacent to the extension region 29 of the drain region of the reset transistor 11.

Here, the source or drain region of the amplification transistor 10 or the address transistor can be the source or drain region of a transistor other than the reset transistor 11.

Thus, in the solid-state imaging device according to the embodiments in the present disclosure, even when a fine transistor is used in the unit pixel cell 13, it is possible to reduce the leakage current which occurs in the silicon substrate 1 as well as in the interface with the silicon substrate 1 and the leakage current caused by stress applied inside the silicon substrate 1 due to the STI structure.

Figure 17:
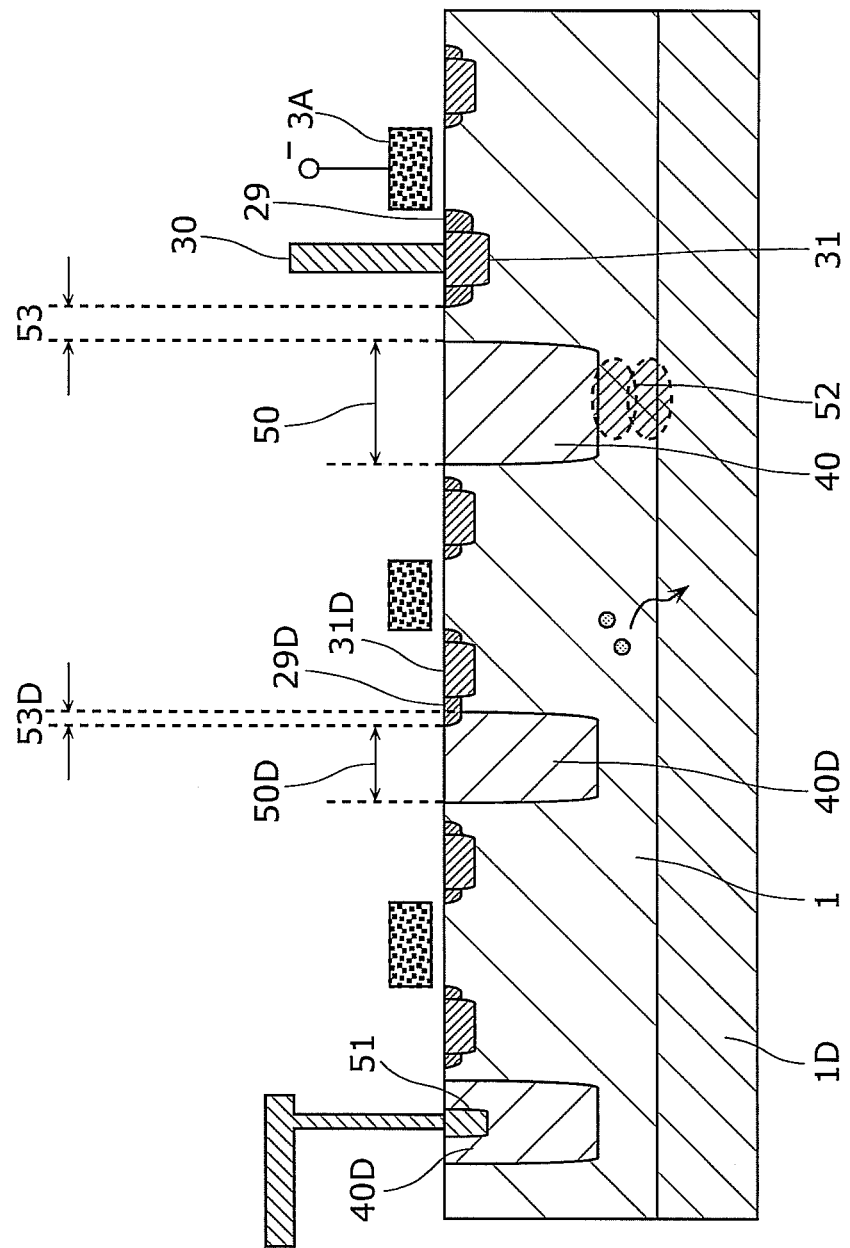
FIG. 17 is a cross-sectional view of a unit pixel cell in a modification of a solid-state imaging device according to Embodiment 7.

It should be noted that in the solid-state imaging device according to the present embodiment, a silicon substrate 1D of high concentration which is the same conductivity type as the silicon substrate 1 may be provided below the silicon substrate 1 as shown in FIG. 17. This can realize the structure in which the silicon substrate 1D of high concentration absorbs the leakage current which occurs in the silicon substrate 1, and further reduce the leakage current.

Moreover, in the solid-state imaging device according to the present embodiment, a deep-part diffusion isolation layer 52 of the same conductivity type as the isolation region 40 may be provided as shown in FIG. 17 to prevent leakage current from flowing through the region below the isolation region 40. This can further reduce the leakage current.

Moreover, in the configuration in FIG. 17, the leakage current can be further reduced by (i) using the conductivity type opposite to that of the silicon substrate 1 as the conductivity type of the silicon substrate 1D of high concentration and (ii) using the structure in which the silicon substrate 1D of high concentration is facilitated to absorb the leakage current. In this case, the resistance in the silicon substrate 1 becomes high, and the potential of the silicon substrate 1 becomes unstable. Here, the potential of the silicon substrate 1 can be stabilized by (i) forming a high-concentration contact diffusion layer 51 in the isolation region 40 or the isolation region 41D, (ii) connecting the high-concentration contact diffusion layer 51 to a metal electrode, and (iii) applying a constant voltage to the high-concentration contact diffusion layer 51.

Figure 18:
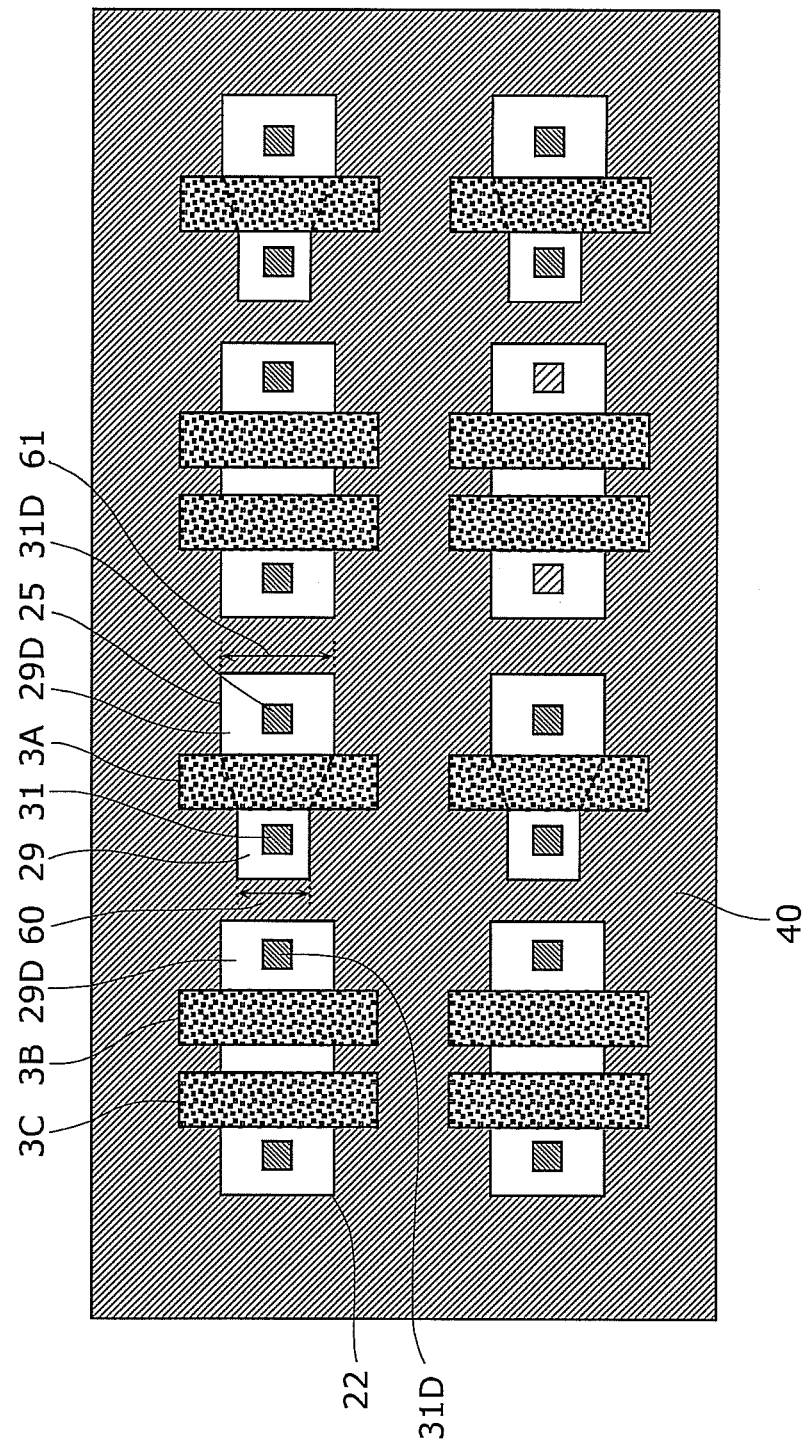
FIG. 18 is a plan view showing the configuration of unit pixel cells in a modification of a solid-state imaging device according to Embodiment 7.
Figure 19:
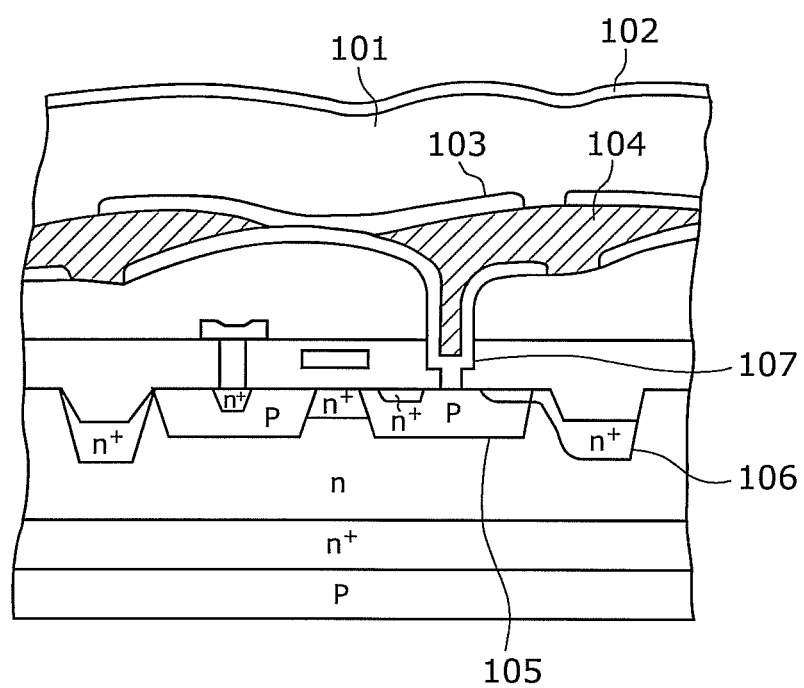
FIG. 19 is a cross-sectional view of the image sensor recited in PTL 3.

Moreover, in the solid-state imaging device according to the present embodiment, as shown in FIG. 18, the isolation region 40 may be formed only of a diffusion layer without the STI structure, and the extension region 29 may be formed so that a width 60 of the extension region 29 is narrower than a width 61 of the extension region 29D. This can decrease the area of the depletion layer in the silicon interface which relates to leakage current, and reduce the leakage current.

The solid-state imaging devices in the present disclosure were described based on the embodiments. However, the present disclosure is not limited to these embodiments. The present disclosure includes an embodiment obtained by making various modifications which those skilled in the art would conceive without departing from the scope of the present disclosure. Moreover, the structural elements in the embodiments may be arbitrarily combined without departing from the scope of the invention.

For example, the widths of the depletion layer in an element isolation depletion region and an under-gate depletion region may be both narrowed by combining (i) the configuration according to Embodiments 1 and 4 in which the width of the depletion layer in the element isolation depletion region is narrowed and (ii) the configuration according to Embodiments 2 and 3 in which the width of the depletion layer in the under-gate depletion region is narrowed. Moreover, the configuration according to Embodiments 5 to 7 in which the element isolation region is made of an impurity region may be applied to the configuration according to Embodiments 1 to 4.

Moreover, in the above embodiments, a first conductivity type is p-type, and a second conductivity type is n-type. For example, the above describes that the conductivity type of the silicon substrate is p-type, and the conductivity type of the transistors in the pixel circuit is n-channel type. However, the conductivity type of the silicon substrate may be n-type, and the conductivity type of the transistors in the pixel circuit may be p-channel type. In this case, voltage potential sings are reversed, and signal charges to be read from a photoelectric conversion film are changed from an electron hole to an electron. Therefore, the source region and the drain region of the reset transistor are also reversed.

Moreover, although transistors making up the pixel circuit are MOS transistors in the above embodiments, other transistors may be used as long as the transistors are filed effect transistors (FETs).

Moreover, in the above embodiments, the p-type semiconductor substrate includes a p-type well formed in the n-type semiconductor substrate.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present disclosure is applicable to solid-state imaging devices and, in particular, to a small image pick-up device of high performance and others.

The invention claimed is:

1. A solid-state imaging device comprising:
   a semiconductor substrate having a first surface and a second surface opposite to the first surface; and
   unit pixel cells two-dimensionally arranged, each unit pixel cell including:
      a photoelectric conversion film, above the first surface of the semiconductor substrate, for photo-electrically converting incident light;
      a transparent electrode on the photoelectric conversion film;
      a pixel electrode between the first surface of the semiconductor substrate and the photoelectric conversion film;
      an amplification transistor, comprising a first gate electrode connected to the pixel electrode, for outputting a signal voltage according to a potential of the pixel electrode;
      a reset transistor, comprising source or drain region of a first conductivity type in the semiconductor substrate and a second gate electrode, the source or drain region being connected to the pixel electrode for resetting a potential of the first gate electrode; and
      a first isolation region, comprising a first region of a second conductivity type in the semiconductor substrate, for electrically isolating the amplification transistor and the reset transistor, wherein
   an impurity concentration of the first region is higher than an impurity concentration of a second conductivity type second region of the second conductivity type between the source or drain region and the second surface of the semiconductor substrate,
   the source or drain region comprises a first impurity region coupled to the pixel electrode, and a second impurity region disposed between the first impurity region and the first region, and
   an impurity concentration of the first impurity region is greater than an impurity concentration of the second impurity region.

2. The solid-state imaging device according to claim 1, wherein
   the reset transistor further includes a channel region of the second conductivity type between the second gate electrode and the second surface of the semiconductor substrate, and
   an impurity concentration of the channel region is higher than an impurity concentration of the second region of the semiconductor substrate.

3. The solid-state imaging device according to claim 2, wherein the reset transistor has a higher threshold voltage than the amplification transistor does.

4. The solid-state imaging device according to claim 3, further comprising a second isolation region for electrically isolating two adjacent unit pixel cells included in the unit pixel cells, the second isolation region being a trench in the semiconductor substrate, between the two adjacent unit pixel cells.

5. The solid-state imaging device according to claim 2, further comprising a second isolation region for electrically isolating two adjacent unit pixel cells included in the unit pixel cells, the second isolation region being a trench in the semiconductor substrate, between the two adjacent unit pixel cells.

6. The solid-state imaging device according to claim 1, wherein when the reset transistor is in OFF state, the second gate electrode has a negative potential relative to a potential of the semiconductor substrate.

7. The solid-state imaging device according to claim 6, further comprising a second isolation region for electrically isolating two adjacent unit pixel cells included in the plurality of unit pixel cells, the second isolation region being a trench in the semiconductor substrate, between the two adjacent unit pixel cells.

8. The solid-state imaging device according to claim 1, wherein
a first PN junction is between the first region and an edge of the second impurity region, and
the first region has a lower impurity concentration than the second impurity region does.

9. The solid-state imaging device according to claim 8, further comprising a second isolation region for electrically isolating two adjacent unit pixel cells included in the unit pixel cells, the second isolation region being a trench in the semiconductor substrate, between the two adjacent unit pixel cells.

10. The solid-state imaging device according to claim 1, wherein
the source or drain region comprises a third impurity region between the first impurity contact region and the second gate electrode,
a first PN junction is between the semiconductor substrate and an edge of the first impurity region on a side where the first isolation region is located,
the first region is spaced apart from the first impurity region.

11. The solid-state imaging device according to claim 10, wherein a distance between the first region and the first impurity region is greater than 0.1 μm.

12. The solid-state imaging device according to claim 11, further comprising a second isolation region for electrically isolating two adjacent unit pixel cells included in the unit pixel cells, the second isolation region being a trench in the semiconductor substrate, between the two adjacent unit pixel cells.

13. The solid-state imaging device according to claim 10, further comprising a second isolation region for electrically isolating two adjacent unit pixel cells included in the unit pixel cells, the second isolation region being a trench in the semiconductor substrate, between the two adjacent unit pixel cells.

14. The solid-state imaging device according to claim 1, wherein the first isolation region further comprises a trench in the semiconductor substrate.

15. The solid-state imaging device according to claim 14, further comprising a second isolation region for electrically isolating two adjacent unit pixel cells included in the unit pixel cells, the second isolation region being a trench in the semiconductor substrate, between the two adjacent unit pixel cells.

16. The solid-state imaging device according to claim 1, wherein a depletion layer formed by a first PN junction nearby the first region is narrower than a depletion layer formed by a second PN junction nearby the second region.

17. The solid-state imaging device according to claim 1, wherein the second gate, the source or drain region, and the first region are arranged in that order in cross-sectional view.

18. The solid-state imaging device according to claim 1, wherein the semiconductor substrate is a semiconductor substrate of the second conductivity type.

19. The solid-state imaging device according to claim 1, wherein
the semiconductor substrate has a well of the second conductivity type, and
at least the source or drain region, the first region, and the second conductivity type second region are included in the well.

20. The solid-state imaging device according to claim 1, wherein the second region is disposed immediately adjacent to the source or drain region.

21. A solid-state imaging device comprising:
a semiconductor substrate having a first surface and a second surface opposite to the first surface; and
unit pixel cells two-dimensionally arranged, each unit pixel cell including:
a photoelectric conversion film, above the first surface of the semiconductor substrate, for photo-electrically converting incident light;
a transparent electrode on the photoelectric conversion film;
a pixel electrode between the first surface of the semiconductor substrate and the photoelectric conversion film;
an amplification transistor, comprising a first gate electrode connected to the pixel electrode and a first source or drain region, for outputting a signal voltage according to a potential of the pixel electrode;
a reset transistor, comprising a second source or drain region of a first conductivity type in the semiconductor substrate and a second gate electrode, the second source or drain region being connected to the pixel electrode for resetting a potential of the first gate electrode; and
a first isolation region, comprising a first region of a second conductivity type in the semiconductor substrate, for electrically isolating the amplification transistor and the reset transistor, wherein
an impurity concentration of the first region is higher than an impurity concentration of a second region of the second conductivity type between the first source or drain region and the second surface of the semiconductor substrate,
a lowermost bottom of the first source or drain region of the amplification transistor is located shallower than a lowermost bottom of the second source or drain region of the reset transistor is, in the semiconductor substrate.

22. The solid-state imaging device according to claim 21, wherein
the reset transistor further includes a channel region of the second conductivity type between the second gate electrode and the second surface of the semiconductor substrate, and
an impurity concentration of the channel region is higher than an impurity concentration of the second region of the semiconductor substrate.

23. The solid-state imaging device according to claim 22, wherein the reset transistor has a higher threshold voltage than the amplification transistor does.

24. The solid-state imaging device according to claim 23, further comprising a second isolation region for electrically isolating two adjacent unit pixel cells included in the unit pixel cells, the second isolation region being a trench in the semiconductor substrate, between the two adjacent unit pixel cells.

25. The solid-state imaging device according to claim 22, further comprising a second isolation region for electrically isolating two adjacent unit pixel cells included in the unit pixel cells, the second isolation region being a trench in the semiconductor substrate, between the two adjacent unit pixel cells.

26. The solid-state imaging device according to claim 21, wherein the first isolation region further comprises a trench in the semiconductor substrate.

27. The solid-state imaging device according to claim 26, further comprising a second isolation region for electrically isolating two adjacent unit pixel cells included in the unit pixel cells, the second isolation region being a trench in the semiconductor substrate, between the two adjacent unit pixel cells.

28. The solid-state imaging device according to claim 21, wherein a depletion layer formed by a first PN junction nearby the first region is narrower than a depletion layer formed by a second PN junction nearby the second region.

29. The solid-state imaging device according to claim 21, wherein
the second source or drain region comprises a first impurity region coupled to the pixel electrode, and a second impurity region disposed between the first impurity region and the first region, and
an impurity concentration of the first impurity region is greater than an impurity concentration of the second impurity region.

30. The solid-state imaging device according to claim 21, wherein the second gate, the second source or drain region, and the first region are arranged in that order in cross-sectional view.

31. The solid-state imaging device according to claim 21, wherein the semiconductor substrate is a semiconductor substrate of the second conductivity type.

32. The solid-state imaging device according to claim 21, wherein
the semiconductor substrate has a well of the second conductivity type, and
at least the second source or drain region, the first region, and the second region are included in the well.

33. The solid-state imaging device according to claim 21, wherein the second region is disposed immediately adjacent to the second source or drain region.

* * * * *